(12) United States Patent
Song et al.

(10) Patent No.: US 9,917,161 B2
(45) Date of Patent: Mar. 13, 2018

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Jungwoo Song, Hwaseong-si (KR); Jaekyu Lee, Seongnam-si (KR); Jaerok Kahng, Seoul (KR); YongJun Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/238,721

(22) Filed: Aug. 16, 2016

(65) Prior Publication Data

US 2017/0062575 A1 Mar. 2, 2017

(30) Foreign Application Priority Data

Aug. 31, 2015 (KR) ........................ 10-2015-0122901

(51) Int. Cl.
| | |
|---|---|
| *H01L 27/108* | (2006.01) |
| *H01L 29/40* | (2006.01) |
| *H01L 29/78* | (2006.01) |
| *H01L 29/66* | (2006.01) |
| *H01L 29/423* | (2006.01) |
| *H01L 27/22* | (2006.01) |

(52) U.S. Cl.
CPC ...... *H01L 29/408* (2013.01); *H01L 27/10823* (2013.01); *H01L 27/10852* (2013.01); *H01L 27/10855* (2013.01); *H01L 27/10891* (2013.01); *H01L 29/4236* (2013.01); *H01L 29/66666* (2013.01); *H01L 29/7827* (2013.01); *H01L 27/10811* (2013.01); *H01L 27/228* (2013.01)

(58) Field of Classification Search
CPC ......... H01L 27/10823; H01L 27/10811; H01L 27/10876; H01L 27/10891; H01L 27/10852; H01L 27/10855; H01L 27/228; H01L 29/66666; H01L 29/7827; H01L 29/408; H01L 29/4236
See application file for complete search history.

(56) References Cited

U.S. PATENT DOCUMENTS

| | | | |
|---|---|---|---|
| 7,564,084 B2* | 7/2009 | Song | ..................... H01L 27/108 257/296 |
| 8,207,032 B2* | 6/2012 | Fischer | ............. H01L 21/82342 438/206 |
| 8,299,562 B2 | 10/2012 | Li et al. | |

(Continued)

FOREIGN PATENT DOCUMENTS

| | | |
|---|---|---|
| JP | 4219630 B2 | 11/2008 |
| JP | 201449481 A | 3/2014 |

*Primary Examiner* — Michael Trinh
(74) *Attorney, Agent, or Firm* — Renaissance IP Law Group LLP

(57) ABSTRACT

A semiconductor device includes active pillars protruding from a semiconductor substrate and spaced apart from each other in a first direction and a second direction that is perpendicular to the first direction, a word line extending in the first direction between the active pillars, a drain region disposed in an upper portion of each of the active pillars, and a separation pattern provided between the word line and the drain region. A bottom surface of the separation pattern is disposed at a lower level than a bottom surface of the drain region.

19 Claims, 24 Drawing Sheets

(56) References Cited

U.S. PATENT DOCUMENTS

| | | |
|---|---|---|
| 8,492,257 B2 | 7/2013 | Shin |
| 8,492,832 B2 | 7/2013 | Kim et al. |
| 8,847,298 B2 | 9/2014 | Thomas |
| 8,865,550 B2 | 10/2014 | Wu et al. |
| 9,105,574 B2 | 8/2015 | Song et al. |
| 9,177,851 B2 | 11/2015 | Min |
| 9,231,066 B2 | 1/2016 | Kim et al. |
| 2005/0151206 A1* | 7/2005 | Schwerin .......... H01L 27/10823 257/390 |
| 2008/0258206 A1* | 10/2008 | Hofmann .......... H01L 27/10823 257/327 |
| 2012/0100704 A1 | 4/2012 | Shin |
| 2012/0153365 A1* | 6/2012 | Sung ................ H01L 27/10876 257/288 |
| 2012/0248518 A1 | 10/2012 | Li et al. |
| 2013/0037882 A1 | 2/2013 | Kim et al. |
| 2014/0021537 A1 | 1/2014 | Kim et al. |
| 2014/0097479 A1 | 4/2014 | Thomas |
| 2014/0213027 A1 | 7/2014 | Wu et al. |
| 2014/0254239 A1 | 9/2014 | Song et al. |
| 2014/0353745 A1 | 12/2014 | Kim et al. |
| 2014/0367775 A1 | 12/2014 | Min |

\* cited by examiner

SEMICONDUCTOR DEVICE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2015-0122901, filed on Aug. 31, 2015, in the Korean Intellectual Property Office, the disclosure of which is hereby incorporated by reference in its entirety.

BACKGROUND

Embodiments of the inventive concepts relate to a semiconductor device and a method of fabricating the same. More particularly, embodiments of the inventive concepts relate to a semiconductor device including a vertical channel transistor and a method of fabricating the same.

A unit cell of a typical semiconductor memory device may include at least one transistor and at least one a data storage structure. For example, a unit cell of a dynamic random access memory (DRAM) device may use a capacitor as the data storage structure, and a unit cell of a static random access memory (SRAM) device may use a flip-flop circuit realized by transistors as the data storage structure. Similarly, a unit cell of a phase-change memory device may use a magnetic tunnel junction (MTJ) as the data storage structure.

SUMMARY

Embodiments of the inventive concepts may provide a semiconductor device that includes a vertical channel transistor.

Embodiments of the inventive concept may also provide a method of fabricating a semiconductor device that includes a vertical channel transistor.

In an aspect, a semiconductor device may include active pillars protruding, or projecting, from a semiconductor substrate and spaced apart from each other in a first direction and a second direction that is substantially perpendicular to the first direction, a word line extending in the first direction between the active pillars, a drain region disposed in an upper portion of each of the active pillars, and a separation pattern provided between the word line and the drain region. A bottom surface of the separation pattern may be disposed at a level that is lower than a bottom surface of the drain region.

In some embodiments, the separation pattern may extend in the first direction to have a line shape that is substantially parallel to the word line.

In some embodiments, the semiconductor device may further include a capping pattern disposed on the word line and having a top surface disposed at the same level as or a level that is lower than a top surface of the active pillar, and a gate insulating layer disposed between the word line and the active pillars and extending onto sidewalls of the capping pattern. The separation pattern may extend to cover a portion of the capping pattern that is adjacent to the separation pattern.

In some embodiments, the separation pattern may have a width that increases as a distance increases from the bottom surface toward a top surface of the separation pattern.

In some embodiments, the bottom surface of the separation pattern may have a first width, and a top surface of the separation pattern may have a second width that is greater than the first width. The separation pattern may include a first portion disposed between the drain region and the word line and between the drain region and the capping pattern, and a second portion disposed on the capping pattern. The first portion of the separation pattern may have a substantially uniform first width, and the second portion of the separation pattern may have a substantially uniform second width.

In some embodiments, the semiconductor device may further include a source region vertically spaced apart from the drain region and disposed in the semiconductor substrate under bottom surfaces of the active pillars and a bottom surface of the word line. The bottom surface of the separation pattern may be in contact with the source region.

In some embodiments, the semiconductor device may further include a pad disposed on each of the active pillars and connected to the drain region. A planar area of the pad may be greater than a planar area of the drain region when viewed from a plan view.

In some embodiments, the semiconductor device may further include a pad disposed on the drain region of each of the active pillars and electrically connected to the drain region. The separation pattern may extend upward, and the pad may be disposed at a side of the separation pattern. The semiconductor device may further include a spacer disposed between the separation pattern and the pad.

In some embodiments, the semiconductor device may further include a pad disposed on each of the active pillars and connected to the drain region, a data storage structure disposed on the pad and connected to the pad, and a bit line disposed on the data storage structure and connected to the data storage structure. The bit line may extend in the second direction.

In an aspect, a semiconductor device may include active pillars protruding, or projecting, from a semiconductor substrate, the active pillars spaced apart from each other in a first direction and a second direction that is substantially perpendicular to the first direction, each of the active pillars including a body portion and a protrusion protruding from a sidewall of a lower portion of the body portion in the first direction, word lines extending in the second direction between the active pillars, and a separation structure disposed on the protrusion of the active pillar. A bottom surface of the separation structure may be disposed at a level between top surfaces and bottom surfaces of the word lines.

In an aspect, a semiconductor device comprises: a plurality of active pillars arranged in an array of rows and columns on a substrate in which each of the active pillars project from the substrate and is spaced apart from each other in a row direction and in a column direction that is substantially perpendicular to the row direction, in which an upper portion of at least one active pillar comprises a drain region, and in which the drain region has a bottom surface; a plurality of word lines in which each word line extends in the row direction between active pillars of a respective row of active pillars; and a separation pattern between the word lines and the drain region in which the separation pattern comprises a plurality of bottom surfaces and in which at least one bottom surface is at a level that is lower than a level of the bottom surface of at least one drain level.

In some embodiments, the semiconductor may further comprise a plurality of data storage structures in which at least one data storage structure may be electrically connected to a corresponding drain region.

In some embodiments, at least one data storage structure may be disposed in a direction from the substrate that is in a same direction as the corresponding active pillar projects from the substrate and in which the corresponding active pillar may be between the at least one data storage structure and the substrate.

In some embodiments at least one data storage structure may comprise a capacitor or a magnetic tunnel junction (MTJ) pattern.

In some embodiments, the separation pattern may comprise a plurality of top surfaces, and the separation pattern may comprise a width that increases as a distance increases from at least one bottom surface of the separation pattern toward at least one top surface of the separation pattern.

In some embodiments, the separation pattern may comprise a plurality of top surfaces in which at least one bottom surface of the separation pattern may comprise a first width in the row direction and a top surface of the separation pattern that corresponds to the at least one bottom surface comprises a second width in the row direction, and in which the second width may be greater than the first width.

In some embodiments, each of the active pillars of the plurality of active pillars may comprise a bottom surface, and the semiconductor device may further comprise a source region in the substrate under the bottom surfaces of the plurality of active pillars in which the source region may be electrically connected to at least one drain region.

In some embodiments, the semiconductor device may further comprises a channel region between the source region and the at least one drain region.

In some embodiments, the source region, the channel region and the at least one drain region may form part of a vertical channel transistor.

BRIEF DESCRIPTION OF THE DRAWINGS

The inventive concepts will become more apparent in view of the attached drawings and accompanying detailed description.

FIGS. 9A to 13A and 18A to 21A are plan views depicting a method of fabricating a semiconductor device according to some embodiments of the inventive concept.

FIGS. 9B to 13B and 18B to 21B are cross-sectional views respectively taken along lines I-I' and II-II' of FIGS. 9A to 13A and 18A to 21A to depict a method of fabricating a semiconductor device according to some embodiments of the inventive concept.

FIGS. 22A to 25A are plan views depicting a method of fabricating a semiconductor device according to some embodiments of the inventive concept.

FIGS. 22B to 25B are cross-sectional views respectively taken along lines III-III' and IV-IV' of FIGS. 22A to 25A to depict a method of fabricating a semiconductor device according to some embodiments of the inventive concept.

DETAILED DESCRIPTION OF EMBODIMENTS

Figure 1:
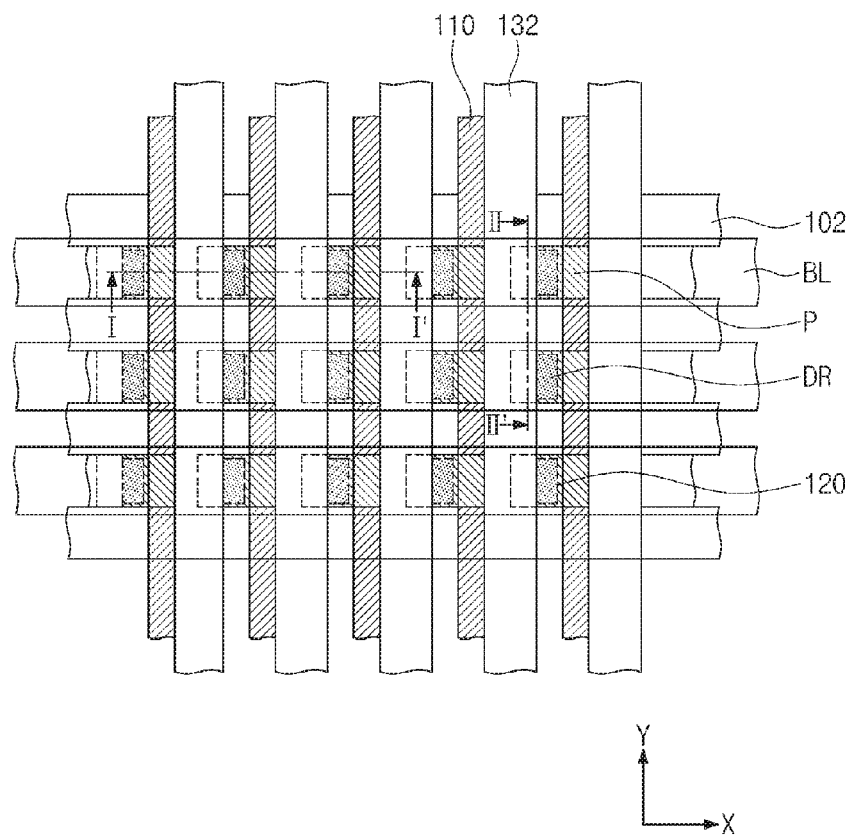
FIG. 1 is a plan view depicting a semiconductor device according to some embodiments of the inventive concept.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Further, example embodiments are described herein with reference to cross-sectional views and/or plan views that are idealized example views. In the drawings, the thicknesses of layers and regions are exaggerated for clarity. Accordingly, variations from the shapes of the views as a result, for example, of manufacturing techniques and/or tolerances, are to be expected. Thus, example embodiments should not be construed as limited to the shapes of regions illustrated herein, but are to include deviations in shapes that result, for example, from manufacturing. For example, an etching region illustrated as a rectangle may, typically, have rounded or curved features. Thus, the regions illustrated in the figures are schematic in nature and their shapes are not intended to illustrate the actual shape of a region of a device and are not intended to limit the scope of example embodiments or the claimed subject matter.

Figure 2:
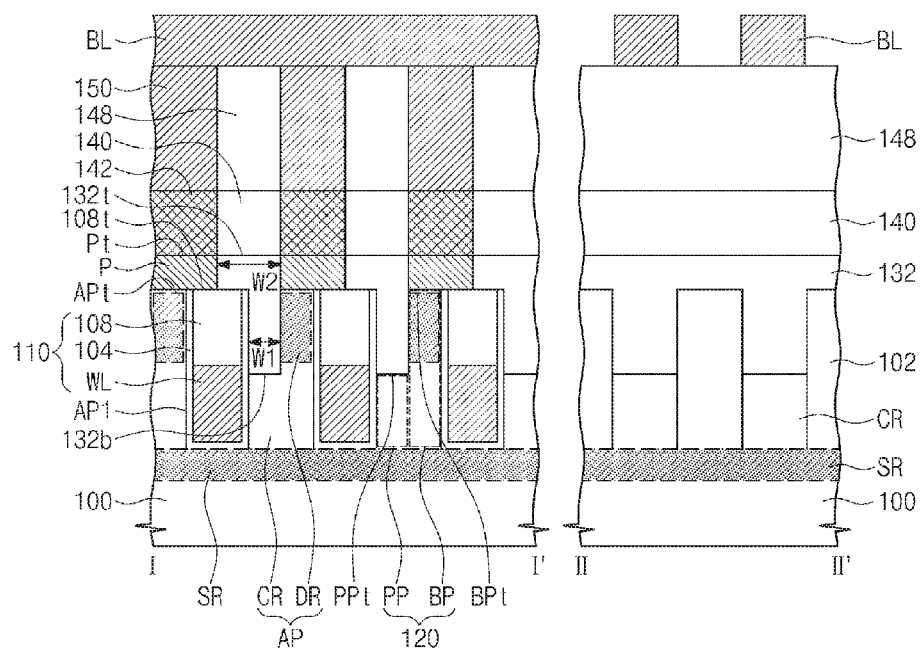
FIG. 2 is a cross-sectional view taken along lines I-I' and II-II' of FIG. 1 to depict a semiconductor device according to some embodiments of the inventive concept.

FIG. 1 is a plan view depicting a semiconductor device according to some embodiments of the inventive concept. FIG. 2 is a cross-sectional view taken along lines I-I' and II-II' of FIG. 1 to depict a semiconductor device according to some embodiments of the inventive concept.

Referring to FIGS. 1 and 2, a device isolation layer 102 may be disposed in a semiconductor substrate 100. The semiconductor substrate 100 may be a silicon substrate, a germanium substrate or a silicon-germanium substrate. In some embodiments, trenches extending in a first direction X may be formed in the semiconductor substrate 100, and the device isolation layer 102 may be formed by filling the trenches with an insulating material. The device isolation layer 102 may include at least a silicon oxide layer or a silicon nitride layer. The device isolation layer 102 may define active regions AP of the semiconductor substrate 100.

The active regions AP may include channel regions CR and drain regions DR. A source region SR may be disposed within the semiconductor substrate 100 and may have a plate shape when viewed in a plan view. The active regions AR and the device isolation layer 102 may be disposed on the source region SR. The source region SR may be used as a common source region of the semiconductor device. The source region SR may be doped with, for example, N-type dopants (e.g., phosphorus or arsenic).

The drain regions DR may be disposed above the source region SR. In other words, the drain regions DR may be vertically spaced apart from the source region SR. The drain regions DR may be disposed in upper portions of the active regions AP, and may have the same conductivity type as the source region SR. For example, the drain regions DR may be doped with N-type dopants (e.g., phosphorus or arsenic).

Each of the channel regions CR may be defined between the source region SR, and each of the drain regions DR within the active region AP. The channel region CR may have a different conductivity type from the conductivity type of the source and drain regions SR and DR. For example, the channel region CR may be doped with P-type dopants (e.g., boron).

The active regions AP may include active pillars 120 that protrude, or project, from the semiconductor substrate 100. The active pillars 120 may be spaced apart from each other in the first direction X and a second direction Y that is perpendicular or substantially perpendicular to the first direction X. Each of the active pillars 120 may include a body portion BP and a protrusion PP that protrudes in the first direction X from a sidewall of a lower portion of the body portion BP. Accordingly, a top surface BPt of the body portion BP of the active pillar 120 may be disposed at a level that is higher than a top surface PPt of the protrusion PP of the active pillar 120.

The drain region DR may be disposed in an upper portion of the body portion BP of the active pillar 120. The source region SR may be disposed in the semiconductor substrate 100 under the active pillars 120 and in regions between active pillars 120. The channel region CR may be defined in a lower portion of the body portion BP disposed between the drain region DR and the source region SR. Additionally, the channel region CR may also be defined in the protrusion PP of the active pillar 120.

Gate patterns 110 may extend in the second direction Y between the active pillars 120. In other words, the gate patterns 110 may intersect the active regions AR to thereby divide the active regions AR into the active pillars 120. The gate patterns 110 may extend in the second direction Y to intersect one sidewall AP1 of the active pillars 120. The gate patterns 110 may be disposed in the semiconductor substrate 100. Each of the gate patterns 110 may include a gate insulating layer 104, a word line WL, and a capping pattern 108.

The word line WL may be disposed in the semiconductor substrate 100 and may be disposed between the channel regions CR of adjacent active pillars 120. The word line WL may include a metal material (e.g., tantalum (Ta), titanium (Ti), aluminum (Al), hafnium (Hf), tungsten (W), and/or molybdenum (Mo)). The capping pattern 108 may be disposed in the semiconductor substrate 100, and a top surface 108t of the capping pattern 108 may be disposed at the same level or a lower level than a top surface APt of the active pillar 120. The capping pattern 108 may include an insulating material (e.g., silicon oxide or silicon nitride). The gate insulating layer 104 may be disposed between the word line WL and the active pillars 120, and may extend onto sidewalls of the capping pattern 108. Additionally, the gate insulating layer 104 may also be disposed between a bottom surface of the word line WL and source region SR and the semiconductor substrate 100. The gate insulating layer 104 may include, for example, at least one of a silicon oxide layer (e.g., a thermal oxide layer), a silicon oxynitride layer or a silicon nitride layer.

Separation patterns 132 may be disposed between the gate patterns 110 and the drain regions DR. The separation patterns 132 may extend as line shapes in the second direction Y and parallel to the gate patterns 110. The separation patterns 132 may be disposed on the protrusions PP of the active pillars 120.

The separation patterns 132 may have bottom surfaces 132b that are disposed at a level between the bottom surface and the top surface of the word line WL. The bottom surfaces 132b of the separation patterns 132 may be in contact with the channel regions CR. The separation patterns 132 may extend onto the gate patterns 110 and be in contact with portions of the top surfaces 108t of the capping patterns 108. The bottom surface 132b of the separation pattern 132 may have a first width W1, and a top surface 132t of the separation pattern 132 may have a second width W2 that is greater than the first width W1 (i.e., W2>W1). A lower portion of the separation pattern 132 that is disposed between the gate pattern 110 and the drain region DR may have a substantially uniform width W1. Additionally, an upper portion of the separation pattern 132, which is disposed on the top surface of the word line WL and the lower portion of the separation pattern 132, may have a substantially uniform width W2. The separation patterns 132 may include an insulating material. For example, the separation patterns 132 may include silicon oxide.

A pad P may be disposed on the body portion BP of each of the active pillar 120. The pad P may be disposed in the first direction X between adjacent separation patterns 132. The pad P may be electrically connected to the drain region DR. A planar area of the pad P as viewed from the plan view of FIG. 1 may be greater than a planar area of the drain region DR when viewed from the plan view of FIG. 1. A top surface Pt of the pad P may be coplanar or substantially coplanar with the top surfaces 132t of the separation patterns 132. The pad P may include a conductive material (e.g. doped poly-silicon).

A first interlayer insulating layer 140 may be disposed on the semiconductor substrate 100. The first interlayer insulating layer 140 may cover the pads P and the separation patterns 132. The first interlayer insulating layer 140 may include an insulating material (e.g. a silicon oxide layer).

Node contacts 142 may penetrate the first interlayer insulating layer 140. The node contacts 142 may be in contact with the respective pads P. In other words, the node contacts 142 may be electrically connected to the respective drain regions DR through the pads P. The node contacts 142 may include, for example, a metal material (e.g., tungsten, aluminum or copper).

A second interlayer insulating layer 148 may be disposed on the node contacts 142 and the first interlayer insulating layer 140, and data storage structures 150 may be provided in the second interlayer insulating layer 148. The data storage structures 150 may be electrically connected to the drain regions DR through the respective node contacts 142. In some embodiments, the data storage structure 150 may include a capacitor or a magnetic tunnel junction (MTJ) pattern. The data storage structures 150 may be organized in an array of a plurality of data storage structures 150 that is arranged to have at least one row and at least one column when viewed from the plan view of FIG. 1. The second interlayer insulating layer 148 may include an insulating material (e.g., a silicon oxide layer or a silicon nitride layer).

Bit lines BL may be disposed on the data storage structures 150 and the second interlayer insulating layer 148. The bit lines BL may extend in the first direction X. Each of the bit lines BL may be connected to a plurality of data storage structures 150 that are arranged along the first direction X. The bit lines BL may be electrically connected to the data storage structures 150. For example, the bit lines BL may include a metal material (e.g., tungsten).

In the semiconductor device according to some embodiments of the inventive concepts, the unit cell may have a layout having an area of $4F^2$ when viewed from the plan view of FIG. 1. As used herein, the term "F" may correspond to the minimum feature of a design rule. For example, the term "F" may be the minimum width that may be defined by a photolithography process. The semiconductor device according to embodiments disclosed herein may include the gate patterns 110 intersecting both sidewalls of the active pillar 120 including the drain region DR and the separation pattern 132 disposed between the drain region DR and one of the gate patterns 110. In other words, the separation pattern 132 may electrically insulate a drain region DR from one gate pattern 110 that is disposed on one side of the active pillar 120, and the gate insulating layer 104 may electrically insulate the drain region DR from a gate pattern 110 that is disposed on the other side of the active pillar 120. As a result, a channel may be generated in the channel region CR of a single active pillar 120 by a single gate pattern 110, thereby making it possible to drive a semiconductor device that includes unit cells of that each has the area of $4F^2$.

Figure 3:
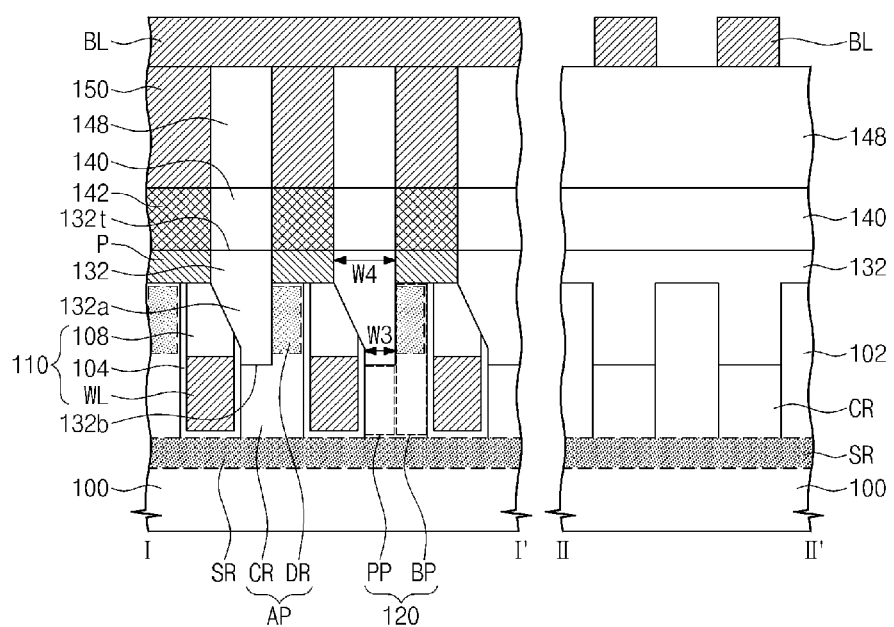
FIG. 3 is a cross-sectional view taken along lines I-I' and II-II' of FIG. 1 to depict a semiconductor device according to another embodiment of the inventive concept.

FIG. 3 is a cross-sectional view taken along lines I-I' and II-II' of FIG. 1 to illustrate a semiconductor device according to another embodiment of the inventive concept. In the present embodiment, the same elements as described in connection with the embodiment of FIG. 2 are indicated by the same reference numerals or the same reference designators, and the descriptions of the same elements as in the embodiment of FIG. 2 will be omitted or mentioned briefly for the purpose of ease and convenience in explanation.

Referring to FIG. 3, a separation pattern 132 may be disposed between the gate pattern 110 and the drain region DR.

The separation pattern 132 may be disposed on the protrusion PP of the active pillar 120, and a bottom surface 132b of the separation pattern 132 may be disposed at a level between the top surface and the bottom surface of the word line WL. The bottom surface 132b of the separation pattern 132 may have a third width W3, and the top surface 132t of the separation pattern 132 may have a fourth width W4 that is greater than the third width W3 (i.e., W4>W3). The separation pattern 132 may include a portion 132a in which a width increases as a distance increases from the bottom surface 132b toward the top surface 132t of the separation pattern 132. One sidewall of the separation pattern 132 that is adjacent to the drain region DR may be substantially vertical with respect to the bottom surface of the separation pattern 132. Another sidewall of the separation pattern 132 that is adjacent to the gate pattern 110 may be inclined, or sloped, with respect to the bottom surface 132b of the separation pattern 132 and may make an angle that is greater than 90 degrees and less than 180 degrees with the bottom surface 132b of the separation pattern 132.

Figure 4:
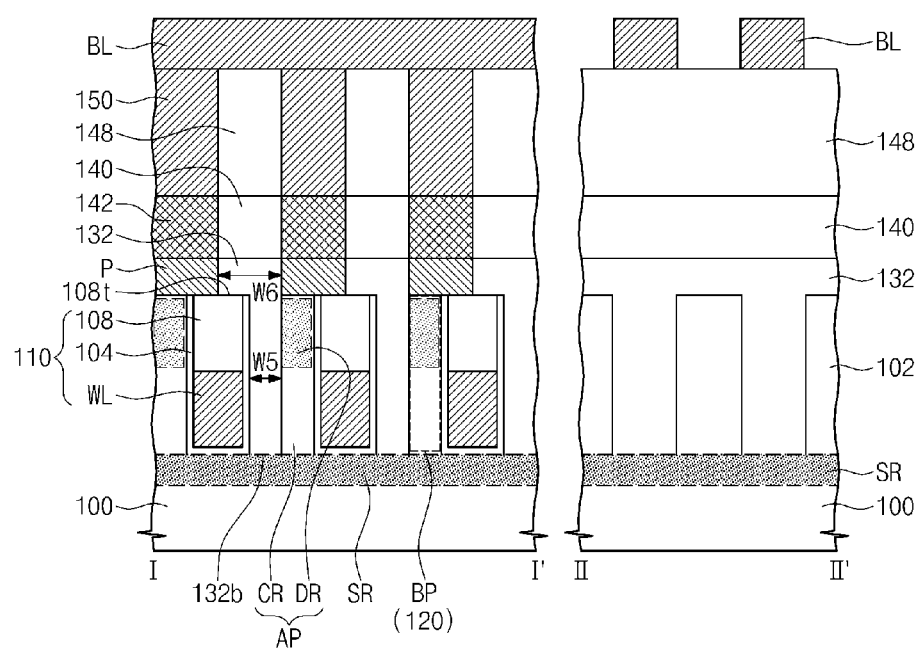
FIG. 4 is a cross-sectional view taken along lines I-I' and II-II' of FIG. 1 to depict a semiconductor device according to another embodiment of the inventive concept.

FIG. 4 is a cross-sectional view taken along lines I-I' and II-II' of FIG. 1 to depict a semiconductor device according to another embodiment of the inventive concept. In the present embodiment, the same elements as described in connection with the embodiment of FIG. 2 are indicated by the same reference numerals or the same reference designators, and the descriptions of the same elements as in the embodiment of FIG. 2 will be omitted or mentioned briefly for the purpose of ease and convenience in explanation.

Referring to FIG. 4, a separation pattern 132 may be disposed between the gate pattern 110 and the drain region DR, and may intersect more of the sidewall of the active pillar 120.

A bottom surface 132b of the separation pattern 132 of the embodiment depicted in FIG. 4 may be disposed at a lower level than the bottom surface of the word line WL. In one embodiment, the bottom surface 132b of the separation pattern 132 may be in contact with the source region SR.

The separation pattern 132 may extend onto the gate pattern 110 and may be in contact with a portion of the top surface 108t of the capping pattern 108. The bottom surface 132b of the separation pattern 132 may have a fifth width W5, and the top surface 132t of the separation pattern 132 may have a sixth width W6 that is greater than the fifth width W5 (i.e., W6>W5). A portion of the separation pattern 132 disposed between the gate pattern 110 and the active pillar 120 may have a substantially uniform width. Additionally, another portion of the separation pattern 132 disposed on the gate pattern 110 may have a substantially uniform width.

Figure 5:
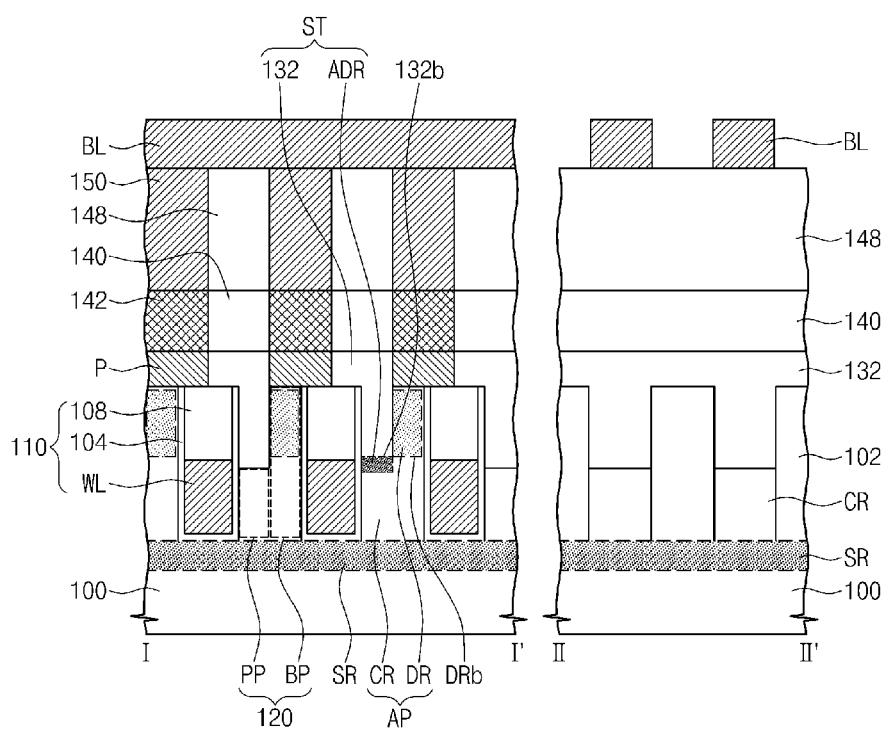
FIG. 5 is a cross-sectional view taken along lines I-I' and II-II' of FIG. 1 to depict a semiconductor device according to another embodiment of the inventive concept.
Figure 6:
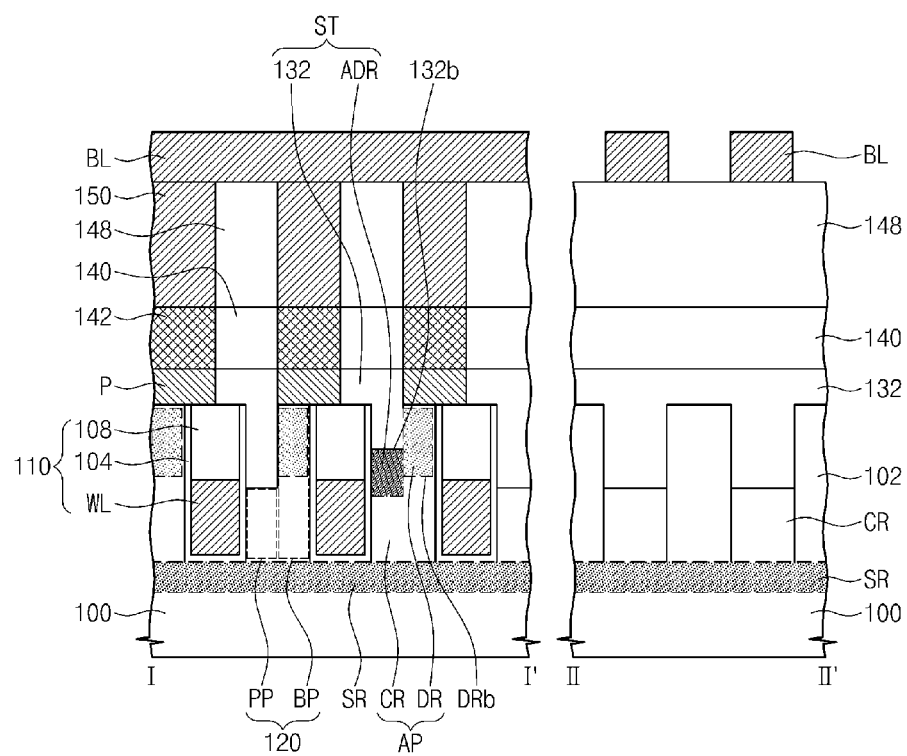
FIG. 6 is a cross-sectional view taken along lines I-I' and II-II' of FIG. 1 to depict a semiconductor device according to another embodiment of the inventive concept.

FIGS. 5 and 6 are cross-sectional views taken along lines I-I' and II-II' of FIG. 1 to depict semiconductor devices according to still other embodiments of the inventive concept. In the present embodiments, the same elements as described in connection with the embodiment of FIG. 2 are indicated by the same reference numerals or the same reference designators, and the descriptions of the same elements as in the embodiment of FIG. 2 will be omitted or mentioned briefly for the purpose of ease and convenience in explanation.

Referring to FIGS. 5 and 6, a bottom surface 132b of at least one of the separation patterns 132 that is disposed on the protrusions PP of the active pillars 120 may be disposed at a level between the bottom surface and the top surface of the word line WL. In some embodiments, the bottom surface 132b of the separation pattern 132 may be disposed at substantially the same level as the bottom surface DRb of the drain region DR, as depicted in FIG. 5. In some embodiments, the bottom surface 132b of the separation pattern 132 may be disposed at a higher level than the bottom surface DRb of the drain region DR, as depicted in FIG. 6. In these embodiments, an additional doped region ADR may be disposed between the bottom surface of the separation pattern 132 and the channel region CR. The additional doped region ADR may have the same conductivity type as the channel region CR. A dopant concentration of the additional doped region ADR may be greater than the dopant concentration of the channel region CR. The separation pattern 132 and the additional doped region ADR may form a separation structure ST.

Since the additional doped region ADR has a high dopant concentration, a threshold voltage of the additional doped region ADR may be greater than the threshold voltage of the channel region CR. The additional doped region ADR may be disposed between the drain region DR and the channel region CR of the protrusion PP of the active pillar 120, and thus, it may more difficult to generate a channel between the drain region DR and the channel region CR of the protrusion PP. As a result, the channel region CR may be controlled by the gate pattern 110 that is adjacent to the drain region DR.

Figure 7:
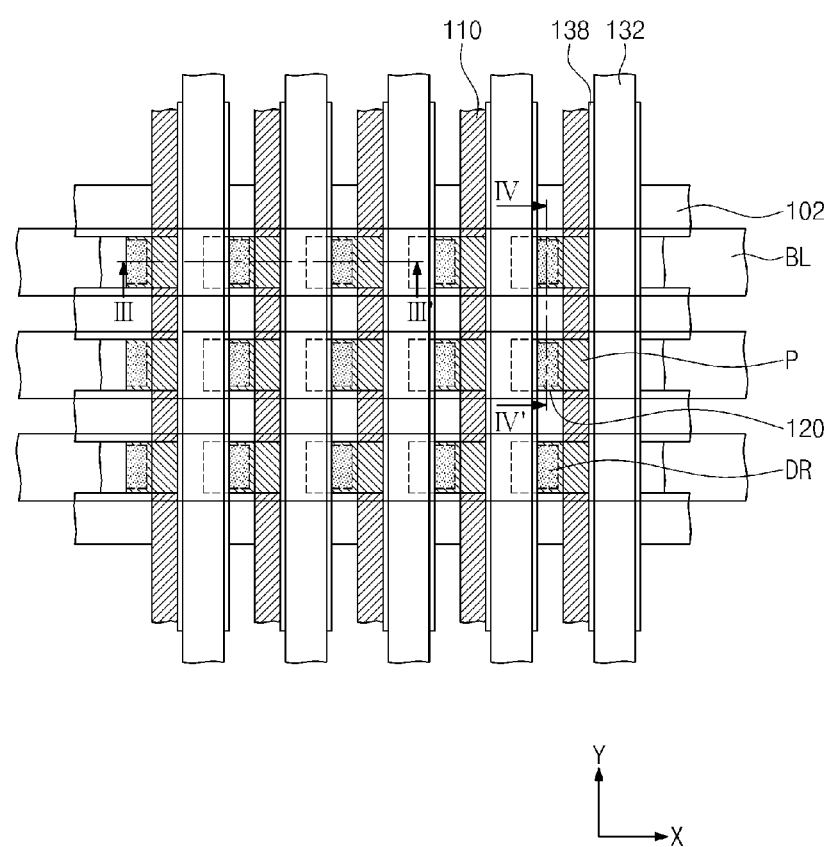
FIG. 7 is a plan view depicting a semiconductor device according to some embodiments of the inventive concept.
Figure 8:
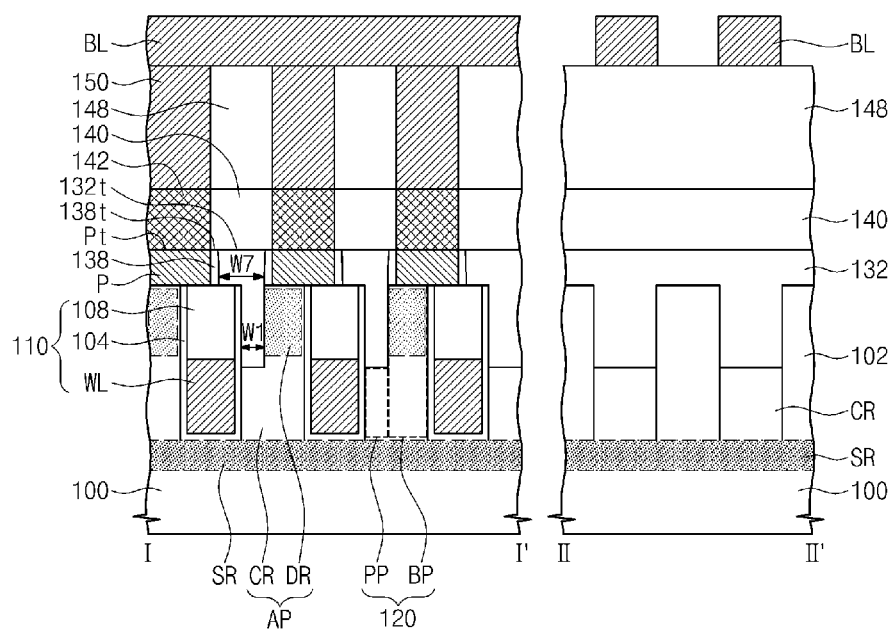
FIG. 8 is a cross-sectional view taken along lines III-III' and IV-IV' of FIG. 7 to depict a semiconductor device according to some embodiments of the inventive concept.

FIG. 7 is a plan view depicting a semiconductor device according to some embodiments of the inventive concept. FIG. 8 is a cross-sectional view taken along lines III-III' and IV-IV' of FIG. 7 to depict a semiconductor device according to some embodiments of the inventive concept. In the present embodiment, the same elements as described in connection with the embodiment of FIGS. 1 and 2 will be indicated by the same reference numerals or the same reference designators, and the descriptions of the same elements as in the embodiment of FIGS. 1 and 2 will be omitted or mentioned briefly for the purpose of ease and convenience in explanation.

Referring to FIGS. 7 and 8, the pad P may be disposed on the body portion BP of the active pillar 120. The separation pattern 132 may be disposed on the protrusion PP of the active pillar 120. The pad P may be disposed between the separation patterns 132 that are adjacent to each other in the first direction X. Spacers 138 may be disposed between the pad P and the separation patterns 132. The spacer 138 may extend in the second direction Y along a sidewall of the separation pattern 132. A top surface 138t of the spacer 138 may be coplanar or substantially coplanar with the top surface Pt of the pad P and the top surface 132t of the separation pattern 132. For example, the spacer 138 may include at least silicon oxide or silicon nitride. The bottom surface 132b of the separation pattern 132 may have a first width W1, which may be substantially equivalent to the first width W1 shown in FIG. 2, and a top surface 132t of the separation pattern 132 may have a second width W7 that is greater than the first width W1 (i.e., W7>W1).

FIGS. 9A to 13A and 18A to 21A are plan views depicting a method of fabricating a semiconductor device according to some embodiments of the inventive concept. FIGS. 9B to 13B and 18B to 21B are respectively cross-sectional views taken along lines I-I' and II-II' of FIGS. 9A to 13A and 18A to 21A to depict a method of fabricating a semiconductor device according to some embodiments of the inventive concept. FIGS. 14 to 17 are cross-sectional views taken along lines I-I' and II-II' of FIG. 13A to depict different methods of fabricating a semiconductor device according to some embodiments of the inventive concept.

Figure 9A:
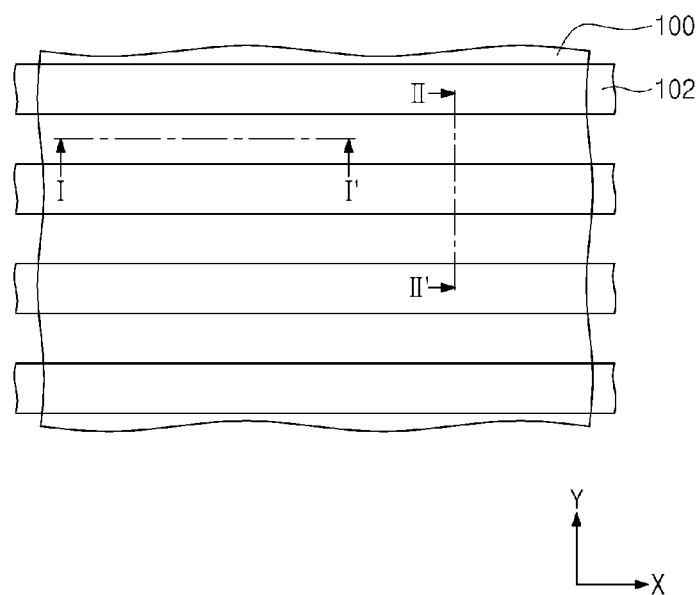
Figure 9B:
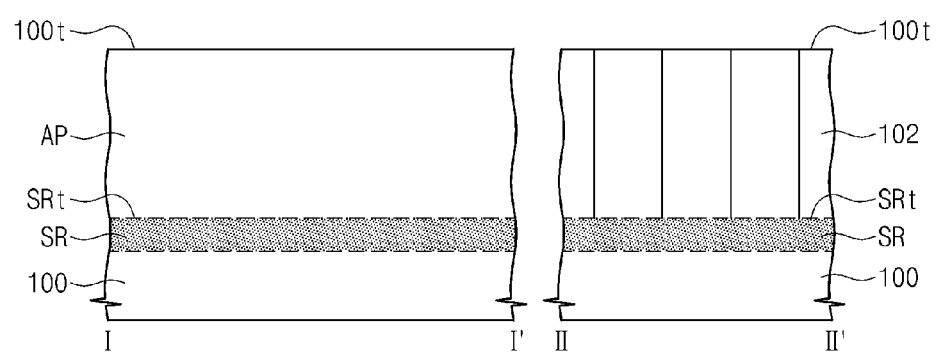

Referring to FIGS. 9A and 9B, a source region SR may be formed in a semiconductor substrate 100. A top surface SRt of the source region SR may be disposed at a predetermined depth from a top surface 100t of the semiconductor substrate 100. The source region SR may have a plate shape within the semiconductor substrate 100 when viewed in the plan view of FIG. 9A. The source region SR may be formed by providing N-type dopants (e.g., phosphorus or arsenic) into the semiconductor substrate 100. The source region SR may be heavily doped with the N-type dopants.

A device isolation layer 102 may be formed in the semiconductor substrate 100 to define active regions AP. The device isolation layer 102 may be formed on the source region SR of the semiconductor substrate 100. The active regions AR may correspond to portions of the semiconductor substrate 100 that are disposed on the source region SR and that are surrounded by the device isolation layer 102. A patterning process may be performed on the semiconductor substrate 100 to form trenches for the device isolation layer 102, and the device isolation layer 102 may be formed by filling the trenches with an insulating material. The trenches may extend in a first direction X (shown in FIG. 9A), and thus, the active regions AP may also extend in the first direction X.

Figure 10A:
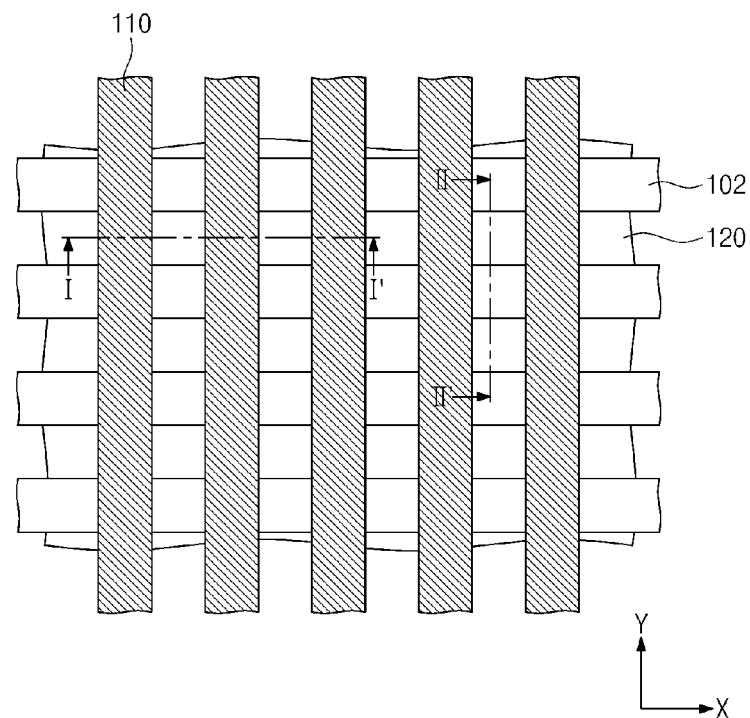
Figure 10B:
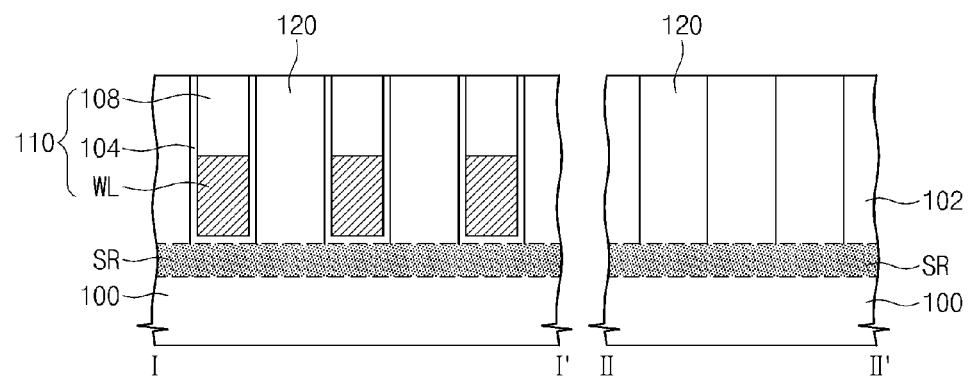

Referring to FIGS. 10A and 10B, gate patterns 110 may be formed in the semiconductor substrate 100. The gate patterns 110 may extend in a second direction Y that is perpendicular or substantially perpendicular to the first direction X to intersect the active regions AP. Forming the gate patterns 110 may include selectively etching the active regions AP and the device isolation layer 102 using a well-known etching technique to form gate trenches that intersect the active regions AP. A gate insulating layer 104 may be formed using a well-known technique to cover inner surfaces of the gate trenches. Word lines WL may be formed by filling lower portions of the gate trenches using a well-known technique, and capping patterns 108 may be formed by filling upper portions of the gate trenches on the word lines WL using a well-known technique.

The gate insulating layer 104 may include at least one of a silicon oxide layer, a silicon nitride layer, a silicon oxynitride layer, or a high-k dielectric layer (e.g., $Al_2O_3$). The gate insulating layer 104 may be formed by a well-known thermal oxidation process and/or a well-known deposition process. The word lines WL may include a metal material (e.g., tantalum (Ta), titanium (Ti), aluminum (Al), hafnium (Hf), tungsten (W), and/or molybdenum (Mo)). The capping pattern 108 may include an insulating material (e.g., silicon oxide or silicon nitride).

The gate patterns 110 (i.e., the gate trenches) may divide the active regions AP into active pillars 120. The active pillars 120 may protrude vertically from the source region SR (e.g., the semiconductor substrate 100). The active pillars 120 may be spaced apart from each other in the first direction X and in the second direction Y. In other words, the active pillars 120 may be two-dimensionally arranged along the first direction X and the second direction Y.

Figure 11A:
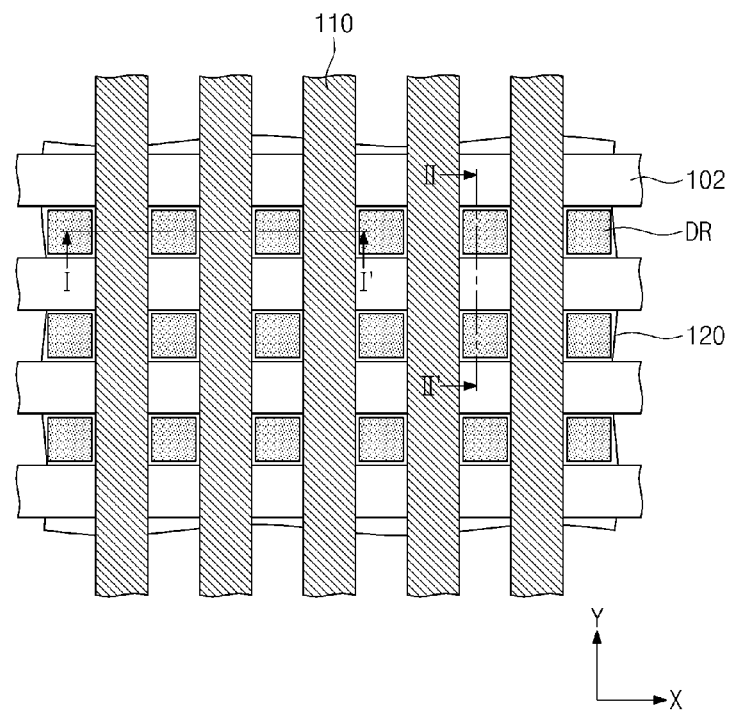
Figure 11B:
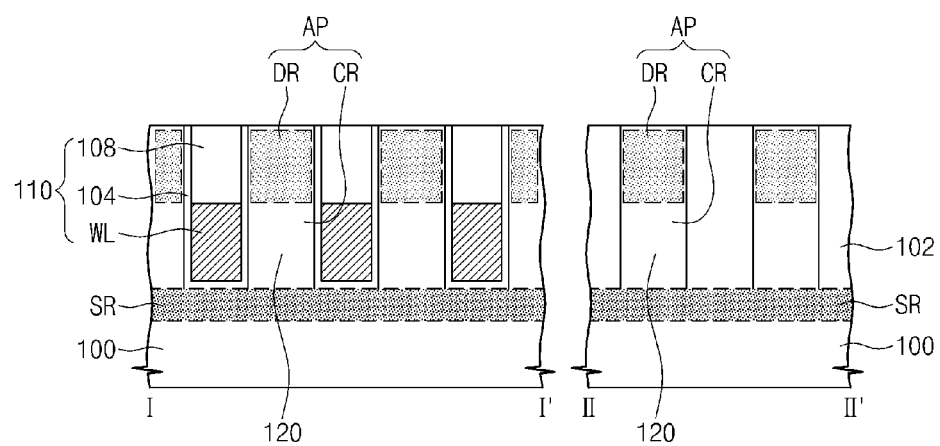

Referring to FIGS. 11A and 11B, channel regions CR may be formed in the active pillars 120. The channel regions CR may be formed on the source region SR. The channel regions CR may be formed using a well-known ion-implantation process. The channel regions CR may have a different conductivity type from the conductivity type of the source region SR. For example, the channel regions CR may be formed by doping the active pillars 120 with P-type dopants (e.g., boron).

Drain regions DR may be formed in the active pillars 120. The drain regions DR may be formed on the respective channel regions CR. Thus, each of the channel regions CR may be disposed between the source region SR and each of the drain regions DR. The drain regions DR may be formed using a well-known ion-implantation process. The drain regions DR may have the same conductivity type as the source region SR. For example, the drain regions DR may be formed by doping upper portions of the active pillars 120 with N-type dopants. A dopant concentration of the drain region DR may be different from the dopant concentration of the source region SR. In some embodiments, the dopant concentration of the drain region D may be less than the dopant concentration of the source region SR.

Thus, each of the active pillars 120 may include a channel region CR and a drain region DR.

Figure 12A:
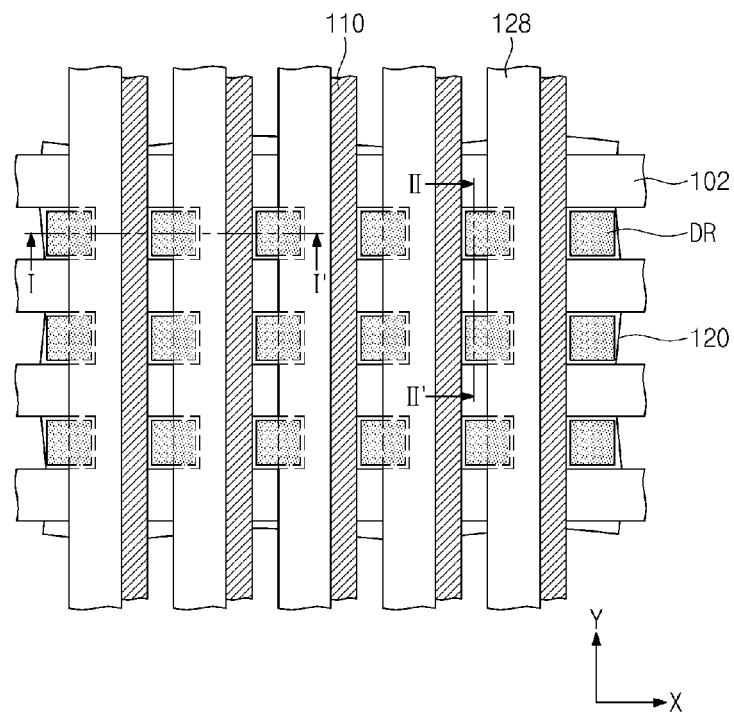
Figure 12B:
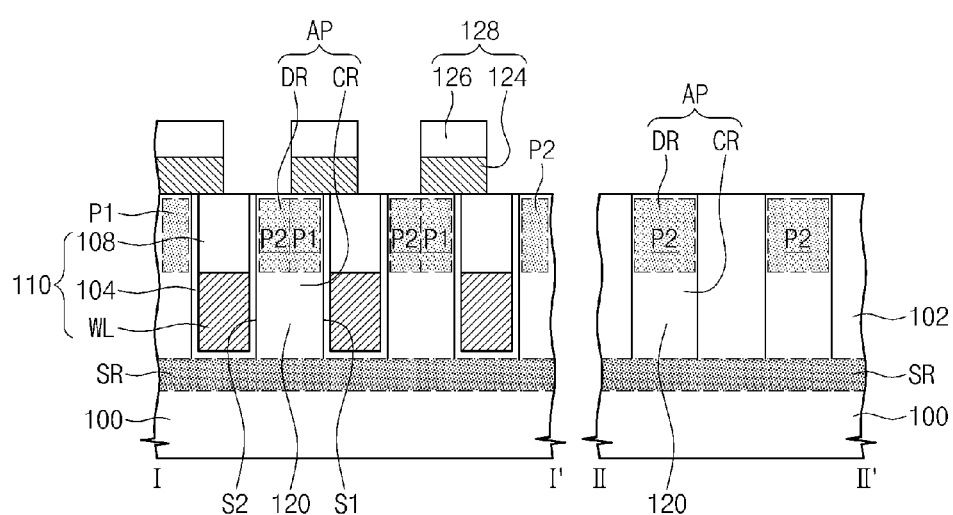

Referring to FIGS. 12A and 12B, mask structures 128 may be formed on the semiconductor substrate 100. Each of the drain regions DR may include a first portion P1 that is adjacent to one sidewall 51 of the active pillar 120 and a second portion P2 that is adjacent to another sidewall S2, which is opposite to the sidewall 51, of the active pillar 120. The mask structures 128 may cover the first portions P1 of the drain regions DR and may extend in the second direction Y. The mask structures 128 may also cover a portion of the gate patterns 110. The second portions P2 of the drain regions DR may be exposed by the mask structures 128.

Each of the mask structures 128 may include a conductive pattern 124 and a first mask pattern 126 that are sequentially stacked on the semiconductor substrate 100. In some embodiments, a conductive layer may be formed on the semiconductor substrate 100. The first mask patterns 126 may be formed on the conductive layer, and the conductive layer may be patterned using the first mask patterns 126 as etch masks to form the conductive patterns 124. The conductive patterns 124 may be formed of, for example, doped poly-silicon. The first mask patterns 126 may be formed of, for example, silicon oxide.

Figure 13A:
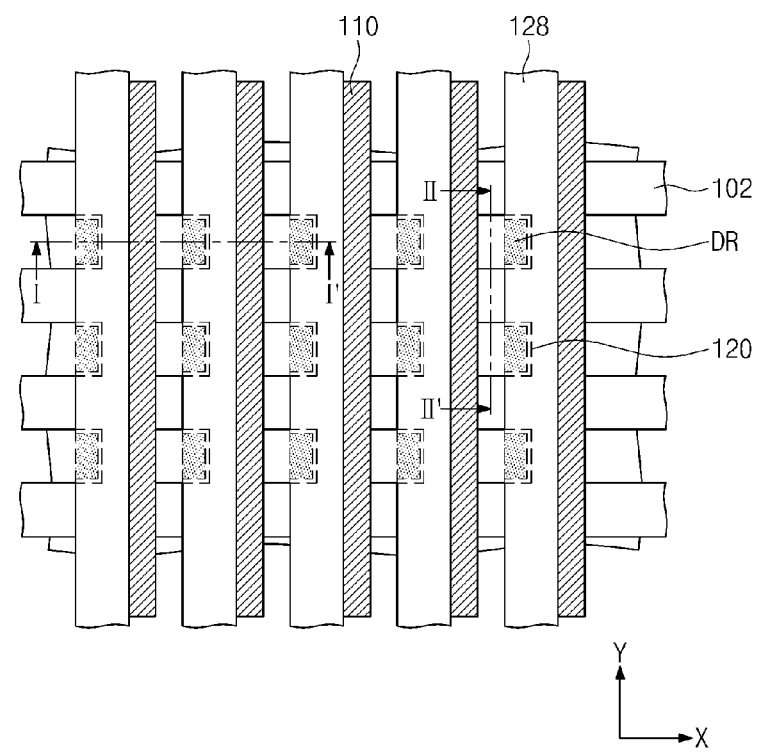
Figure 13B:
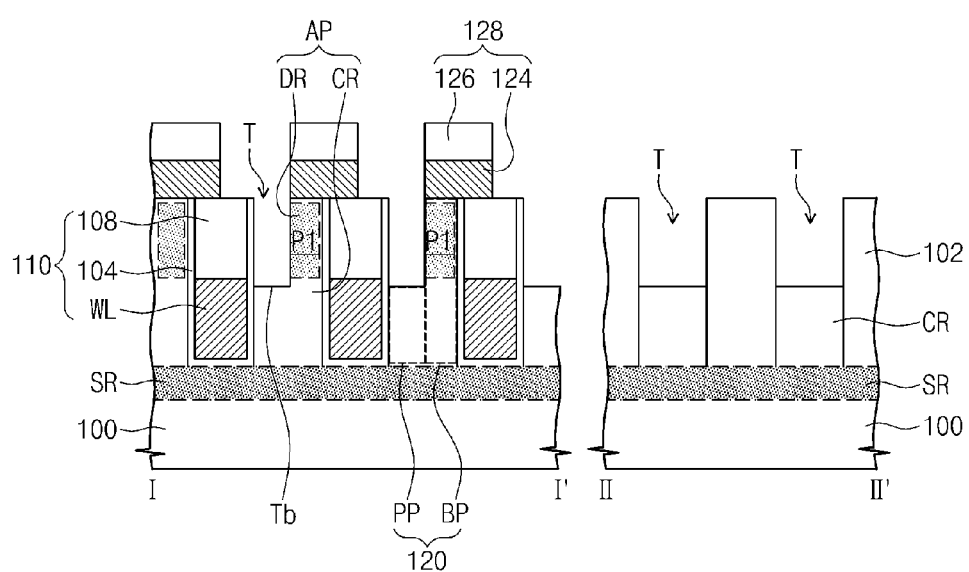

Referring to FIGS. 13A and 13B, the second portions P2 of the drain regions DR that are exposed by the mask structures 128 may be etched to form recess regions T in the active pillars 120. The etching process performed on the second portions P2 of the drain regions DR may be a well-known anisotropic etching process using an etchant having an etch selectivity with respect to the capping pattern 108 and the gate insulating layer 104. The etching process may be performed until bottom surfaces Tb of the recess regions T are disposed at a level that is between a top surface and a bottom surface of the word line WL. Thus, the channel regions CR may be exposed by the depth of the bottom surfaces Tb of the recess regions T. Since the recess regions T are formed in the active pillars 120, the drain region DR (i.e., the first portion P1 of the drain region DR) may be spaced apart from one of a pair of word lines WL that are disposed at both sides of each of the active pillars 120, and may be adjacent to the other of the pair of word lines WL.

The recess region T may be formed in each of the active pillars 120, and thus, each of the active pillars 120 may include a body portion BP and a protrusion PP that protrudes from a sidewall of a lower portion of the body portion BP in the first direction X.

The recess regions T may be formed in various forms based on an etching method and an etching degree.

Figure 14:
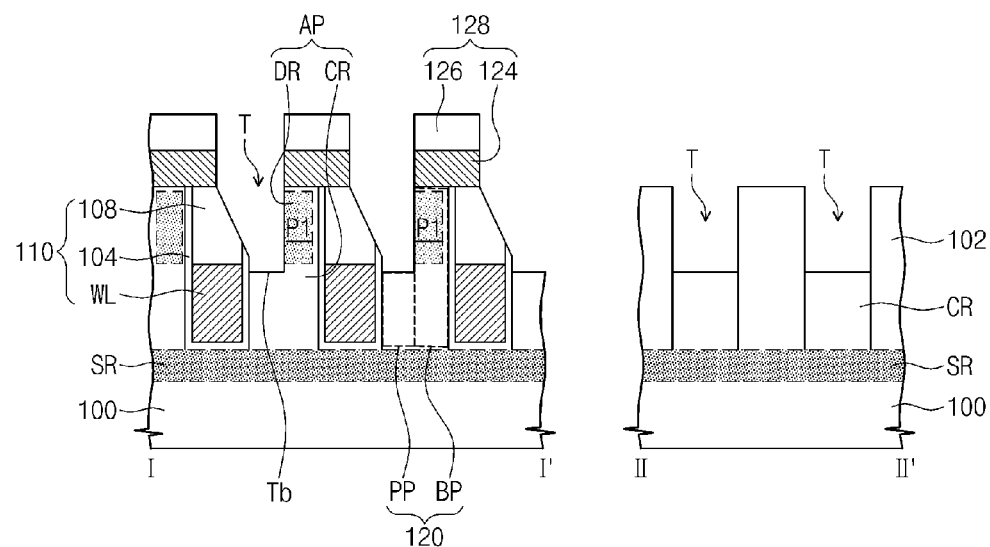
FIGS. 14 to 17 are cross-sectional views respectively taken along lines I-I' and II-II' of FIG. 13A to depict methods of fabricating a semiconductor device according to some embodiments of the inventive concept.

Referring to FIG. 14, in some embodiments, portions of the capping patterns 108 exposed by the mask structures 128 may be etched together with the second portions P2 of the drain regions DR during the etching process to form the recess regions T. The etching process may use an etching solution. During the etching process, an etch rate of the active pillars 120 may be greater than the etch rate of the capping patterns 108. The etching process may be performed until the bottom surfaces Tb of the recess regions T are disposed at a level that is between the top surface and the bottom surface of the word line WL. The channel region CR may be exposed by the depth of the bottom surface Tb of the recess region T. The drain region DR may be exposed by one sidewall of the recess region T, and the capping pattern 108 may be exposed by another sidewall of the recess region T. A width of the bottom surface Tb of the recess region T may be less than a width of a top end of the recess region T. The recess region T may have a width that increases as a distance increases from the bottom surface of the recess region T.

Figure 15:
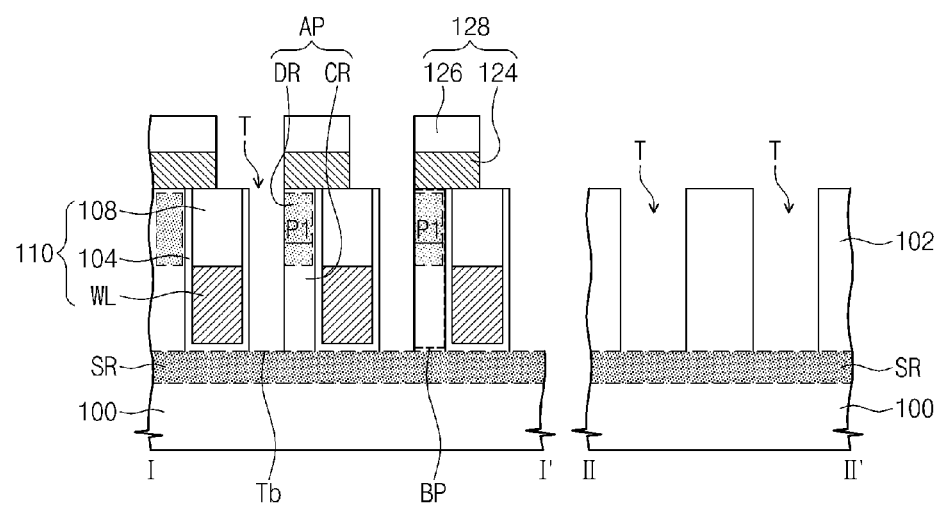

Referring to FIG. 15, the etching process may be performed until the source region SR is exposed by bottom surfaces Tb of the recess regions T. In other words, the recess regions T may penetrate the active pillars 120 so that the bottom surfaces of the recess regions T may be disposed at a level that is lower than the bottom surface of the word line WL. The recess region T may be formed to have a substantially uniform width in the X direction.

In some embodiments, all recess regions T may not have bottom surfaces that are formed by the etching process that are disposed at a level that is between the top surface and bottom surface of the word line WL.

Figure 16:
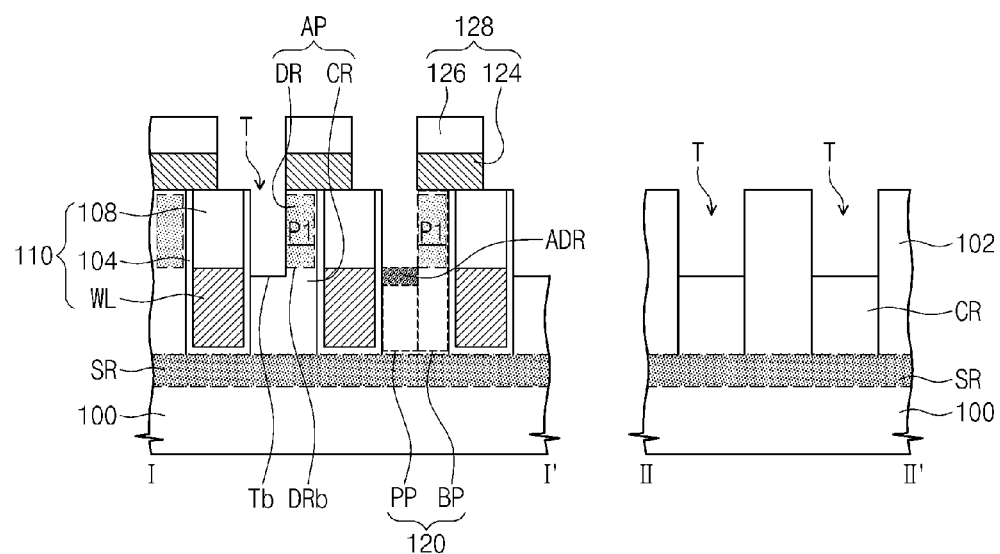
Figure 17:
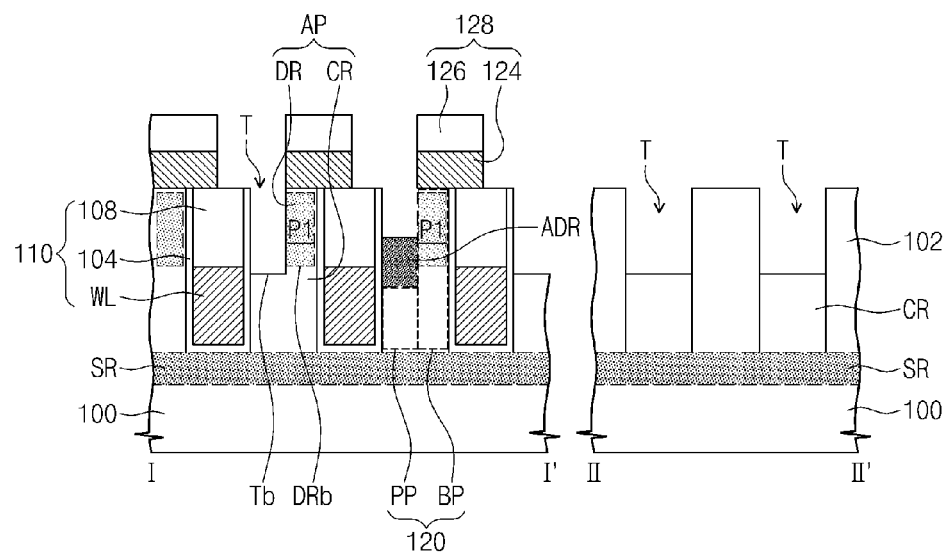

In some embodiments, at least one of the recess regions T may have a bottom surface that is disposed at the substantially same level as the bottom surface of the drain region DR, as depicted in FIG. 16. In some embodiments, at least one of the recess regions T may have a bottom surface Tb that is disposed at a level that is higher than the bottom surface DRb of the drain region DR, as depicted in FIG. 17. In such embodiments, a well-known ion-implantation process may be performed on the active pillars 120 that are exposed by the recess regions T, thereby forming additional doped regions ADR in the active pillars 120. The ion-implantation process may be performed until the additional doped region ADR is formed in the channel region CR.

The additional doped region ADR may have the same conductivity type as the channel region CR. A dopant concentration of the additional doped region ADR may be greater than the dopant concentration of the channel region CR.

Figure 18A:
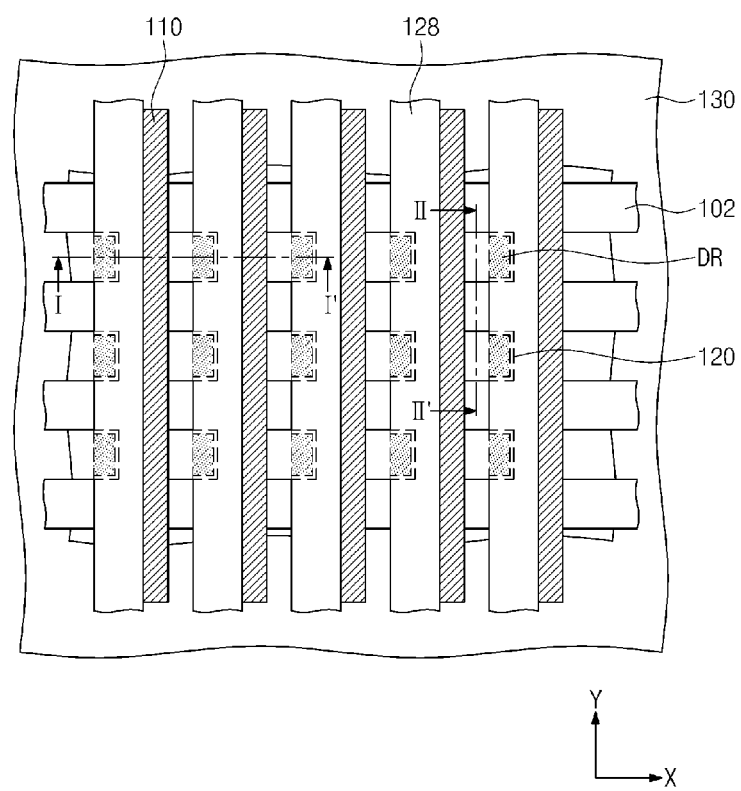
Figure 18B:
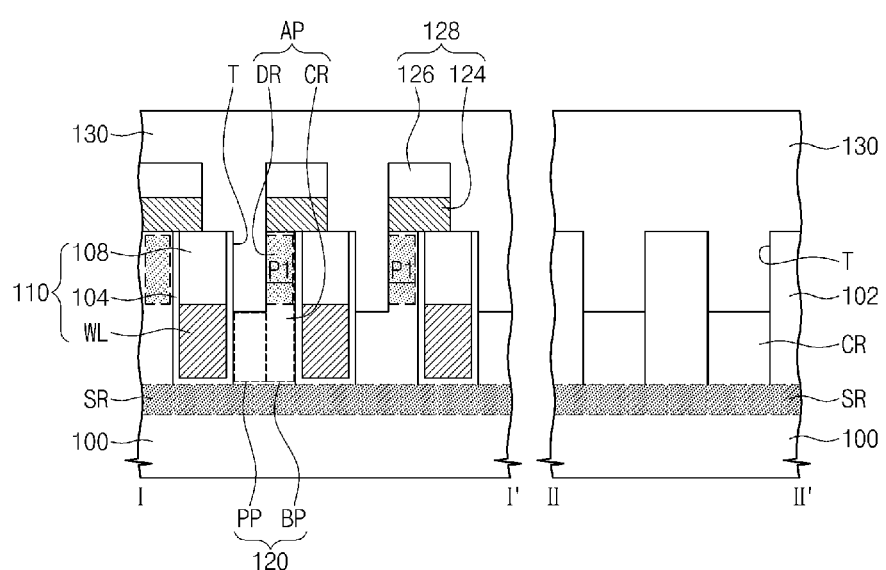

Referring to FIGS. 18A and 18B, an insulating layer 130 may be formed on an entire surface of the semiconductor substrate 100. The insulating layer 130 may fill the recess regions T and may cover the mask structures 128 and the gate patterns 110. The insulating layer 130 may be formed of an insulating material (e.g., a silicon oxide layer).

Figure 19A:
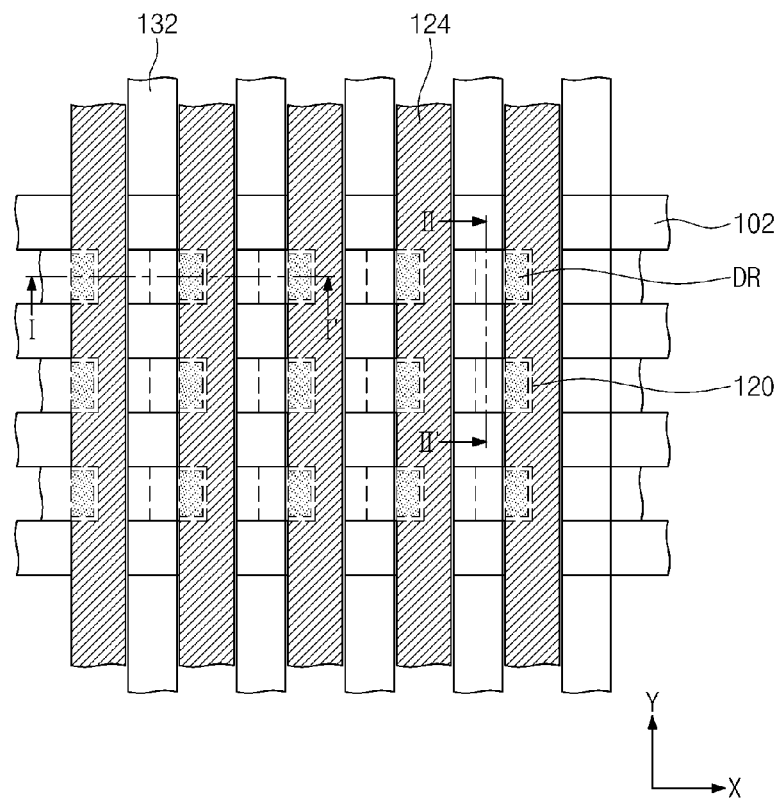
Figure 19B:
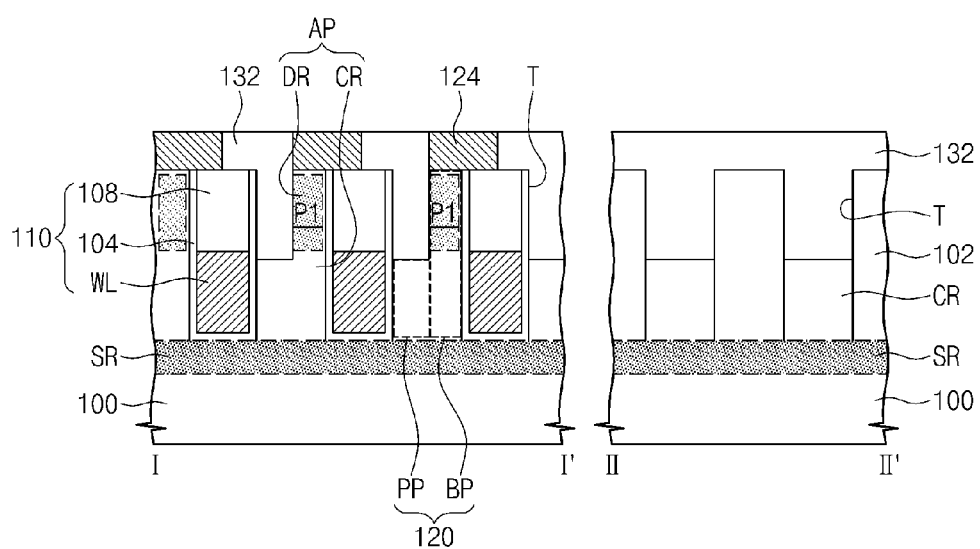

Referring to FIGS. 19A and 19B, a planarization process may be performed on the insulating layer 130 to form the separation patterns 132. The planarization process may be performed until top surfaces of the conductive patterns 124 are exposed, thereby removing an upper portion of the insulating layer 130 and the first mask patterns 126. The planarization process may include a well-known chemical mechanical polishing (CMP) process or a well-known etch-back process.

The separation patterns 132 may be formed between the active pillars 120 and may extend to cover portions of the capping patterns 108. In the active pillars 120, the separation pattern 132 may be disposed between the gate pattern 110 and the drain region DR and may extend in the second direction Y. On the gate patterns 110 (i.e., on the semiconductor substrate 100), the separation pattern 132 may extend in the second direction Y between the conductive patterns 124.

In some embodiments, the separation pattern 132 may have a bottom surface disposed at a level that is between the top surface and the bottom surface of the word line WL. In other words, the bottom surface of the separation pattern 132 may be disposed at a lower level than the bottom surface of the drain region DR.

Figure 20A:
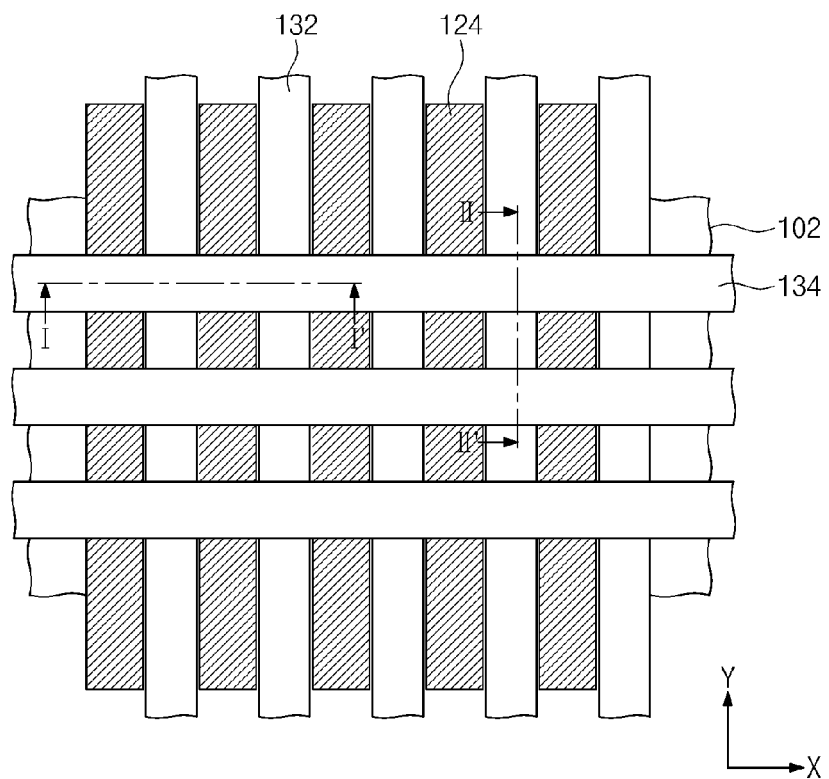
Figure 20B:
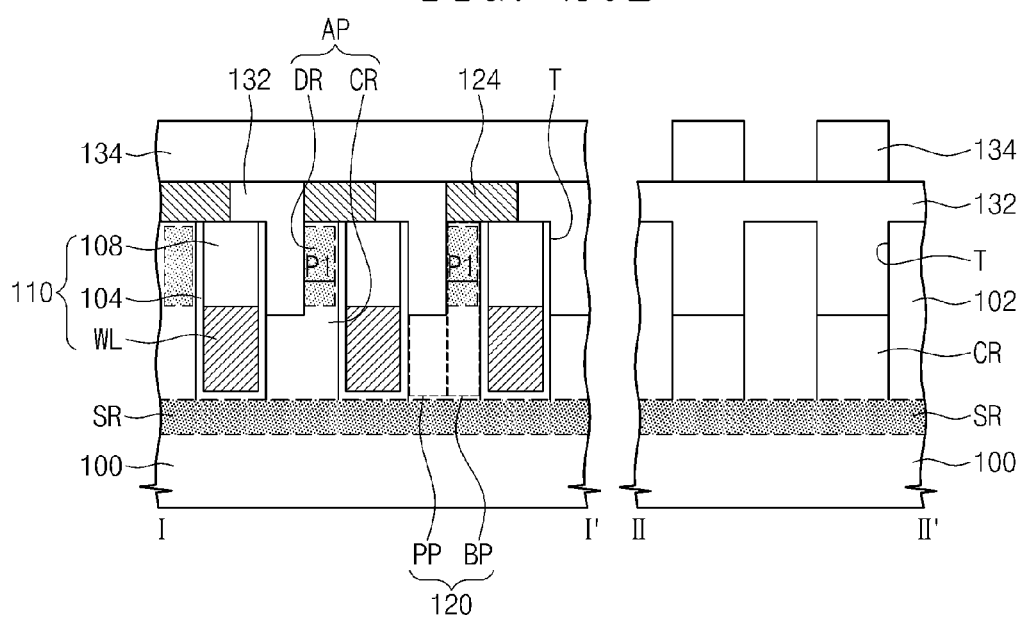

Referring to FIGS. 20A and 20B, second mask patterns 134 may be formed on the separation patterns 132 and the conductive patterns 124. Each of the second mask patterns 134 may extend in the first direction X to cover the active pillars 120 that are arranged in the first direction X when viewed from the plan view of FIG. 20A. Portions of the conductive patterns 124 may be exposed by the second mask patterns 134. The second mask patterns 134 may be formed of a material having an etch selectivity with respect to the conductive patterns 124. For example, the second mask patterns 134 may be formed of silicon oxide or silicon nitride.

Figure 21A:
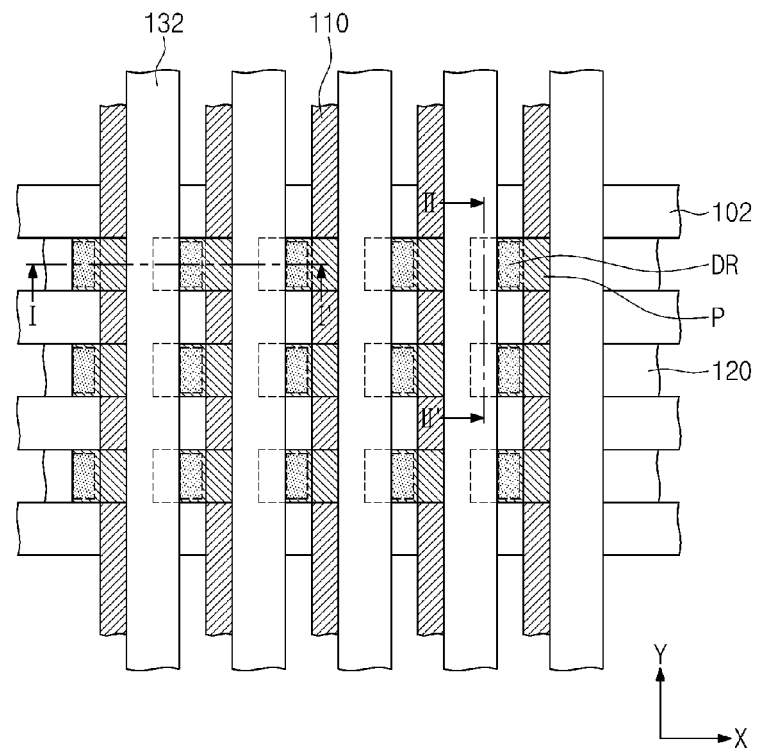
Figure 21B:
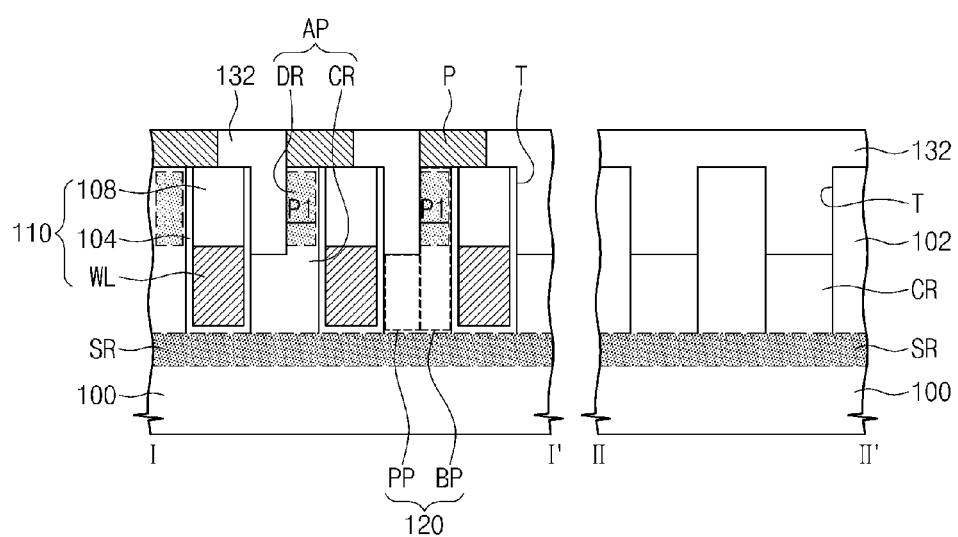

Referring to FIGS. 21A and 21B, the conductive patterns 124 may be etched using the second mask patterns 134 as etch masks to form pads P on the respective active pillars 120. The pads P may be disposed between the separation patterns 132 that are adjacent to each other in the first direction X. A pad P may be in contact with the drain region DR of the active pillar 120. That is, the pad P may be electrically connected to the drain region DR. The etching process to form the pads P may be a well-known wet etching process or a well-known dry etching process. The second mask patterns 134 may be removed after the formation of the pads P using a well-known technique.

Referring again to FIGS. 1 and 2, a first interlayer insulating layer 140 may be formed on the semiconductor substrate 100, and a patterning process may be performed on the first interlayer insulating layer 140 to form openings exposing the respective pads P. Node contacts 142 may be formed by filling the openings with a metal material (e.g., tungsten, aluminum, or tungsten). The node contacts 142 may be electrically connected to the respective drain regions DR. A second interlayer insulating layer 148 may be formed on the node contacts 142 and the first interlayer insulating layer 140, and data storage structures 150 may be formed in the second interlayer insulating layer 148. The data storage structures 150 may be electrically connected to the respective drain regions DR. For example, the data storage structure 150 may be a capacitor or a MTJ pattern. The data storage structures 150 may be organized in an array of a plurality of data storage structures 150 that is arranged to have at least one row and at least one column when viewed from the plan view of FIG. 1 The first and second interlayer insulating layers 140 and 148 may be formed of an insulating material (e.g., silicon oxide or silicon nitride).

Bit lines BL may be formed on the second interlayer insulating layer 148. Each of the bit lines BL may extend in the first direction X and may be connected to a plurality of data storage structures 150 that are arranged in the first direction X. The bit lines BL may be formed of a metal material (e.g., tungsten).

FIGS. 22A to 25A are plan views depicting a method of fabricating a semiconductor device according to some embodiments of the inventive concept. FIGS. 22B to 25B are respectively cross-sectional views taken along lines III-III' and IV-IV' of FIGS. 22A to 25A to depict a method of fabricating a semiconductor device according to some embodiments of the inventive concept. In the present embodiment, the same elements as described in connection with the embodiment of FIGS. 9A to 13A and 18A to 21A and 9B to 13B and 18B to 21B will be indicated by the same reference numerals or the same reference designators, and the descriptions of the same elements will be omitted or mentioned briefly for the purpose of ease and convenience in explanation.

Figure 22A:
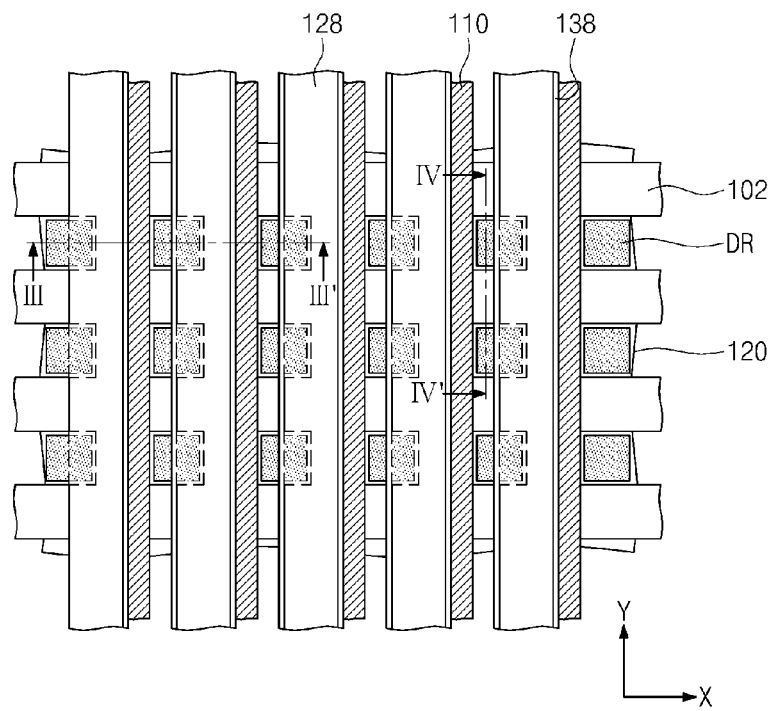
Figure 22B:
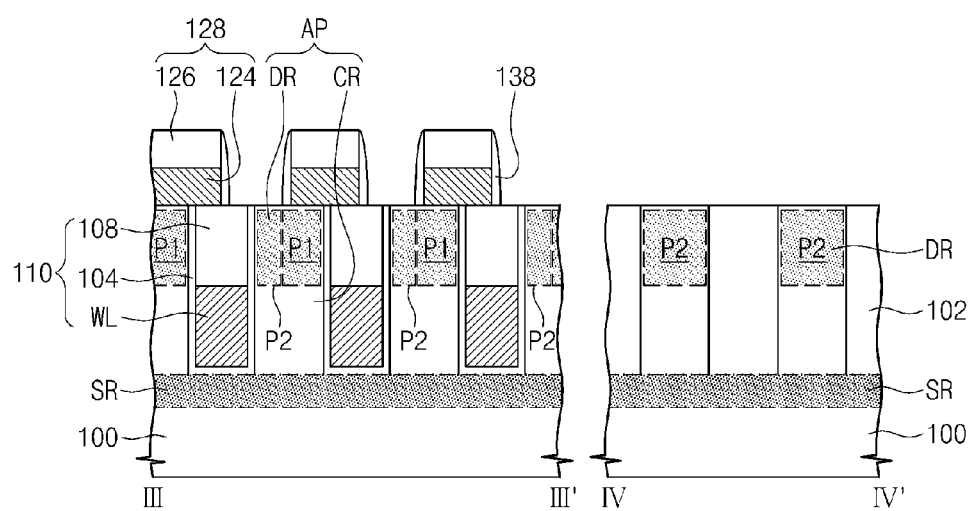

Referring to FIGS. 22A and 22B, spacers 138 may be formed on both sidewalls of each of the mask patterns 128. The spacers 138 may extend in the second direction Y along the sidewalls of the mask structures 128. An insulating layer may be conformally formed on the top surfaces of the active pillars 120 and surfaces of the mask structures 128, and a well-known etch-back process may be performed on the insulating layer to form the spacers 138. For example, the spacers 138 may be formed of silicon oxide or silicon nitride.

Figure 23A:
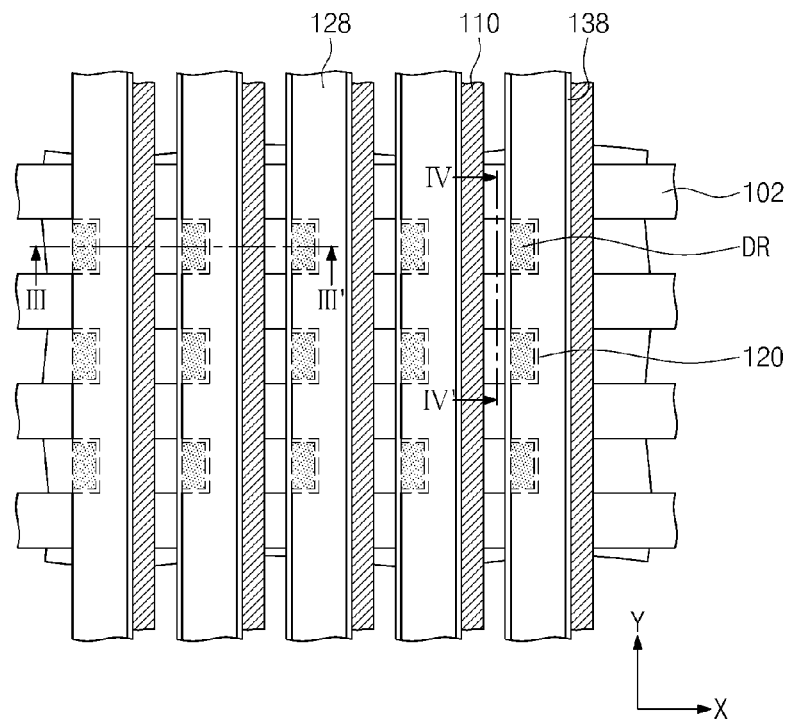
Figure 23B:
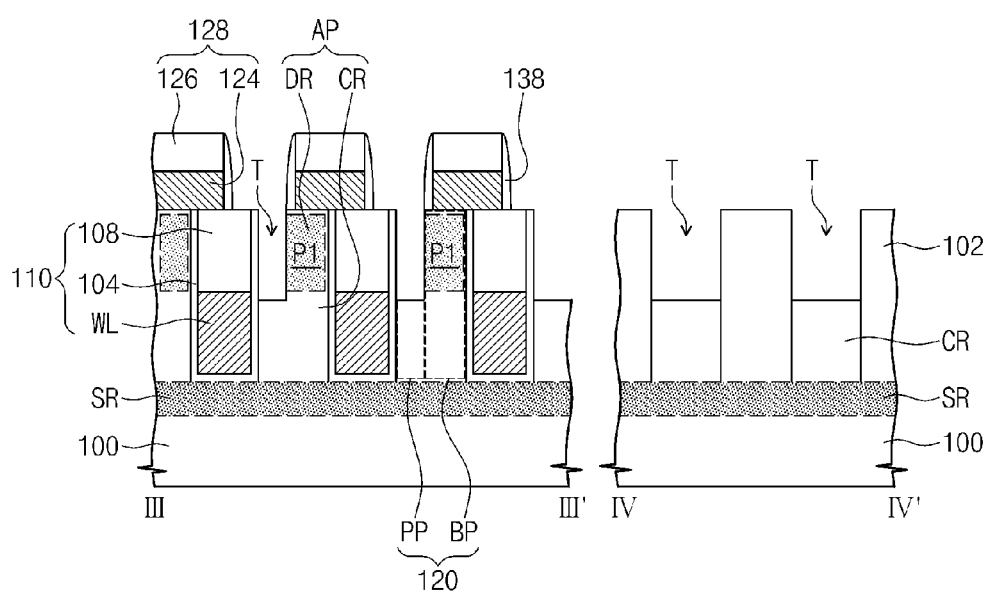

Referring to FIGS. 23A and 23B, second portions P2 of the drain regions DR exposed by the mask structures 128 and the spacers 138 may be etched to form recess regions T in the active pillars 120. The etching process may be performed until the bottom surfaces of the recess regions T are disposed at a level that is between the top surface and the bottom surface of the word line WL. Since the conductive pattern 124 includes doped poly-silicon, the sidewalls of the conductive pattern 124 may be etched at the same time the second portions P2 of the drain regions DR are etched. The spacers 138 may, however, be formed on the sidewalls of the conductive pattern 124, and thus, the sidewalls of the conductive pattern 124 may be protected by the spacers 138 during the etching process.

Figure 24A:
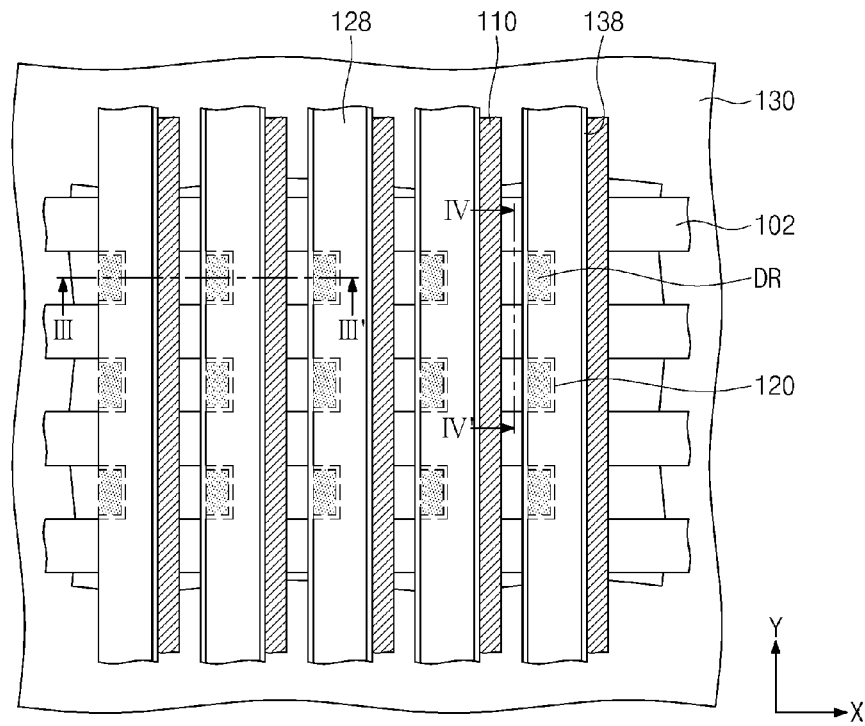
Figure 24B:
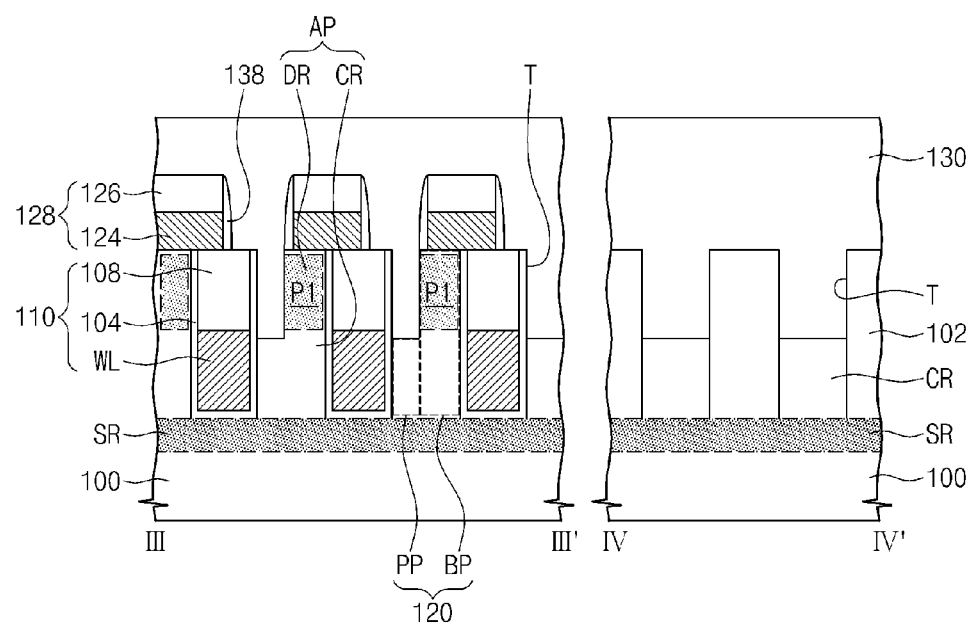

Referring to FIGS. 24A and 24B, an insulating layer 130 may be formed on an entire surface of the semiconductor substrate 100. The insulating layer 130 may fill the recess regions T and may cover the mask structures 128, the spacers 138, and the gate patterns 120.

Figure 25A:
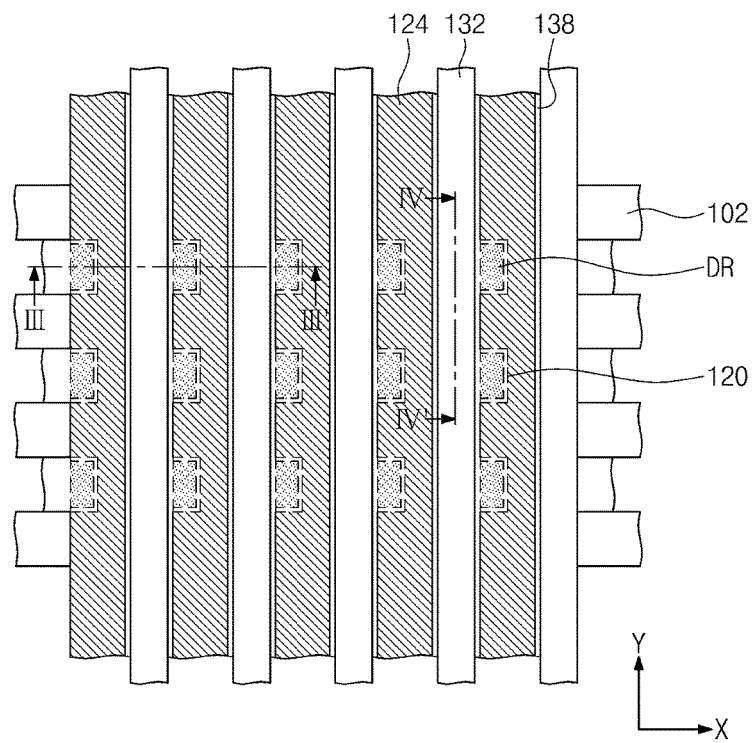
Figure 25B:
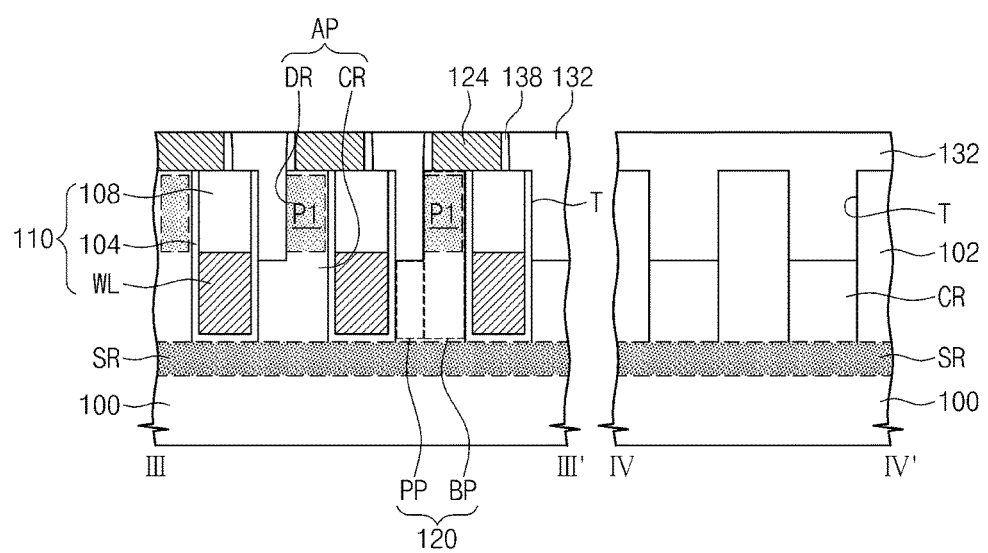

Referring to FIGS. 25A and 25B, a well-known planarization process may be performed on the insulating layer 130 to form separation patterns 132. The planarization process may be performed until the top surface of the conductive pattern 124 is exposed, thereby removing an upper portion of the insulating layer 130, upper portions of the spacers 138, and the first mask patterns 126. The separation pattern 132 may extend in the second direction Y between the spacers 138.

Referring again to FIGS. 7 and 8, the conductive patterns 124 may be etched to form pads P on the active pillars 120. The node contact 142 and the data storage structure 150 may be sequentially formed on each of the pads P. The data storage structures 150 may be organized in an array of a plurality of data storage structures 150 that is arranged to have at least one row and at least one column when viewed from the plan view of FIG. 7. The bits lines BL may be formed to extend in the first direction X. Each of the bit lines BL may be connected to a plurality of data storage structures 150 that are arranged in the first direction X.

The semiconductor device according to some embodiments of the inventive concept may include the gate patterns intersecting both sidewalls of the active pillar including the drain region and the separation pattern disposed between the drain region and one of the gate patterns. The separation pattern may electrically insulate the drain region from one of the gate patterns disposed at both sides of the active pillar. Thus, the channel may be generated in the single active pillar by the single gate pattern.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept are to be determined by the broadest permissible interpretation of the following claims and their equivalents, and shall not be restricted or limited by the foregoing description.

What is claimed is:

1. A semiconductor device, comprising:
   active pillars protruding from a semiconductor substrate, the active pillars spaced apart from each other in a first direction and a second direction that is substantially perpendicular to the first direction;

a word line extending in the first direction between the active pillars;

a drain region disposed in an upper portion of each of the active pillars;

a separation pattern provided between the word line and the drain region, wherein a bottom surface of the separation pattern is disposed at a level that is lower than a level of a bottom surface of the drain region;

a capping pattern disposed on the word line, the capping pattern having a top surface that is disposed at the same level as or a lower level than a level of a top surface of one of the active pillars; and a gate insulating layer disposed between the word line and the active pillars, the gate insulating layer extending onto sidewalls of the capping pattern, wherein the separation pattern extends to cover a portion of the capping pattern adjacent to the separation pattern.

2. The semiconductor device of claim 1,
wherein the separation pattern extends in the first direction to have a line shape that is substantially parallel to the word line.

3. The semiconductor device of claim 1,
wherein the separation pattern has a width that increases as a distance increases from the bottom surface toward a top surface of the separation pattern.

4. The semiconductor device of claim 1,
wherein the bottom surface of the separation pattern has a first width,
wherein a top surface of the separation pattern has a second width that is greater than the first width,
wherein the separation pattern comprises:
a first portion disposed between the drain region and the word line and between the drain region and the capping pattern; and
a second portion disposed on the capping pattern,
wherein the first portion of the separation pattern has a substantially uniform first width, and
wherein the second portion of the separation pattern has a substantially uniform second width.

5. The semiconductor device of claim 1, further comprising:
a source region vertically spaced apart from the drain region and disposed in the semiconductor substrate under bottom surfaces of the active pillars and a bottom surface of the word line,
wherein the bottom surface of the separation pattern is in contact with the source region.

6. The semiconductor device of claim 1, further comprising:
a pad disposed on each of the active pillars and connected to the drain region,
wherein a planar area of the pad is greater than a planar area of the drain region when viewed from a plan view.

7. The semiconductor device of claim 1, further comprising:
a pad disposed on the drain region of each of the active pillars and electrically connected to the drain region, and the pad disposed at a side of the separation pattern that extends upward; and
a spacer disposed between the separation pattern and the pad.

8. The semiconductor device of claim 1, further comprising:
a pad disposed on each of the active pillars and connected to the drain region;
a data storage structure disposed on the pad and connected to the pad; and
a bit line disposed on the data storage structure and connected to the data storage structure,
wherein the bit line extends in the second direction.

9. A semiconductor device, comprising:
active pillars protruding from a semiconductor substrate, the active pillars spaced apart from each other in a first direction and a second direction that is substantially perpendicular to the first direction, and each of the active pillars including a body portion and a protrusion protruding in the first direction from a sidewall of a lower portion of the body portion;
word lines extending in the second direction between the active pillars;
a separation structure disposed on the protrusion,
wherein a bottom surface of the separation structure is disposed at a level between top surfaces of the word lines and bottom surfaces of the word lines;
a capping pattern disposed on the word line,
the capping pattern having a top surface that is disposed at the same level as or a lower level than a level of a top surface of one of the active pillars; and
a gate insulating layer disposed between the word line and the active pillars,
the gate insulating layer extending onto sidewalls of the capping pattern,
wherein the separation structure extends to cover a portion of the capping pattern adjacent to the separation structure.

10. The semiconductor device of claim 9, further comprising:
a drain region disposed in an upper portion of the body portion, the drain region being adjacent to one of the word lines;
a source region vertically spaced apart from the drain region and disposed in the semiconductor substrate under the bottom surfaces of the word lines and bottom surfaces of the active pillars; and
a channel region disposed in each of the active pillars between the drain region and the source region,
wherein the bottom surface of the separation structure is in contact with the channel region.

11. The semiconductor device of claim 10,
wherein the separation structure comprises:
a separation pattern disposed on the protrusion,
the separation pattern having a bottom surface disposed at the same level as or a level that is higher than the top surfaces of the word lines; and
an additional doped region disposed between the bottom surface of the separation pattern and the source region,
wherein a dopant concentration of the additional doped region is greater than that of the channel region.

12. The semiconductor device of claim 9,
wherein the bottom surface of the separation structure has a first width, and
wherein a top surface of the separation structure has a second width that is greater than the first width.

13. The semiconductor device of claim 12, further comprising:
a pad disposed on the body portion,
wherein a top surface of the pad is substantially coplanar with the top surface of the separation structure.

14. The semiconductor device of claim 9,
wherein the separation structure includes an insulating material.

15. A semiconductor device, comprising:
a plurality of active pillars arranged in an array of rows and columns on a substrate, each of the active pillars projecting from the substrate and spaced apart from each other in a row direction and in a column direction that is substantially perpendicular to the row direction, an upper portion of at least one active pillar comprising a drain region, and the drain region having a bottom surface;
a plurality of word lines, each word line extending in the row direction between active pillars of a respective row of the plurality of active pillars;
a separation pattern between one of the word lines and the drain region, the separation pattern comprising a bottom surface, the bottom surface of the separation pattern being at a level that is lower than a level of the bottom surface of the drain region;
a capping pattern disposed on the word line,
the capping pattern having a top surface that is disposed at the same level as or a lower level than a level of a top surface of one of the active pillars; and
a gate insulating layer disposed between the word line and the active pillars,
the gate insulating layer extending onto sidewalls of the capping pattern,
wherein the separation pattern extends to cover a portion of the capping pattern adjacent to the separation pattern.

16. The semiconductor device of claim 15,
wherein the separation pattern comprises a top surface, and
wherein the separation pattern comprises a width that increases as a distance increases from the bottom surface of the separation pattern toward the top surface of the separation pattern.

17. The semiconductor device of claim 15,
wherein the separation pattern comprises a top surface,
wherein the bottom surface of the separation pattern comprises a first width in the row direction and the top surface of the separation pattern comprises a second width in the row direction, and
wherein the second width is greater than the first width.

18. The semiconductor device of claim 15,
wherein the plurality of active pillars comprises a bottom surface,
wherein the semiconductor device further comprising a source region in the substrate under the bottom surfaces of the plurality of active pillars, the source region being electrically connected to the drain region.

19. The semiconductor device of claim 18, further comprising a channel region between the source region and the drain region.

* * * * *